US011191158B2

(12) United States Patent
Yan et al.

(10) Patent No.: US 11,191,158 B2
(45) Date of Patent: Nov. 30, 2021

(54) CIRCUIT BOARD AND PROCESS FOR PREPARING THE SAME

(71) Applicant: SHENGYI TECHNOLOGY CO., LTD., Guangdong (CN)

(72) Inventors: Shanyin Yan, Guangdong (CN); Yongjing Xu, Guangdong (CN); Zhongqiang Yang, Guangdong (CN); Yongming Zhu, Guangdong (CN)

(73) Assignee: SHENGYI TECHNOLOGY CO., LTD.

( * ) Notice: Subject to any disclaimer, the term of this patent is extended or adjusted under 35 U.S.C. 154(b) by 355 days.

(21) Appl. No.: 15/316,380

(22) PCT Filed: Dec. 7, 2015

(86) PCT No.: PCT/CN2015/096520
§ 371 (c)(1),
(2) Date: Dec. 6, 2016

(87) PCT Pub. No.: WO2017/035974
PCT Pub. Date: Mar. 9, 2017

(65) Prior Publication Data
US 2017/0238417 A1    Aug. 17, 2017

(30) Foreign Application Priority Data
Aug. 28, 2015 (CN) .......................... 201510546802.7

(51) Int. Cl.
| H05K 1/03 | (2006.01) |
| C03C 25/47 | (2018.01) |
| C03C 25/1095 | (2018.01) |
| D06M 15/53 | (2006.01) |
| C09D 109/00 | (2006.01) |
| C09D 171/12 | (2006.01) |
| D06M 11/44 | (2006.01) |
| D06M 11/45 | (2006.01) |
| D06M 11/46 | (2006.01) |
| D06M 15/233 | (2006.01) |
| D06M 23/10 | (2006.01) |
| H05K 3/38 | (2006.01) |
| H05K 1/02 | (2006.01) |
| C08K 3/22 | (2006.01) |
| D06M 101/00 | (2006.01) |

(52) U.S. Cl.
CPC ....... *H05K 1/0306* (2013.01); *C03C 25/1095* (2013.01); *C03C 25/47* (2018.01); *C09D 109/00* (2013.01); *C09D 171/12* (2013.01); *D06M 11/44* (2013.01); *D06M 11/45* (2013.01); *D06M 11/46* (2013.01); *D06M 15/233* (2013.01); *D06M 15/53* (2013.01); *D06M 23/10* (2013.01); *H05K 1/0366* (2013.01); *H05K 3/381* (2013.01); *C08K 3/22* (2013.01); *C08K 2003/222* (2013.01); *C08K 2003/2227* (2013.01); *C08K 2003/2241* (2013.01); *D06M 2101/00* (2013.01); *H05K 1/024* (2013.01); *H05K 1/0373* (2013.01)

(58) Field of Classification Search
USPC .................................................. 428/209, 418
See application file for complete search history.

(56) References Cited

U.S. PATENT DOCUMENTS

| 2009/0191387 A1 | 7/2009 | Sankar et al. |
| 2013/0075138 A1 | 3/2013 | Yu et al. |
| 2013/0115472 A1 | 5/2013 | Yu et al. |
| 2013/0161080 A1 | 6/2013 | Lin |
| 2016/0007452 A1* | 1/2016 | Yan ............................ C08J 5/24 442/64 |

FOREIGN PATENT DOCUMENTS

| CN | 101570640 A | 11/2009 |
| CN | 102304264 A | 1/2012 |
| CN | 102548200 | 7/2012 |
| CN | 102633952 A | 8/2012 |
| CN | 103421273 A | 12/2013 |
| CN | 103755989 A | 4/2014 |
| CN | 103881059 A | 6/2014 |
| GN | 101494949 A | 7/2009 |
| WO | 2015106479 | 7/2015 |

OTHER PUBLICATIONS

ISA / CN, International Search Report and Written Opinion, prepared for PCT/CN2015/096520, dated Jun. 8, 2016.
Extended European Search Report for U.S. Appl. No. 15/902,780.4, dated Mar. 18, 2019, 10 pgs., European Patent Office, Germany.

* cited by examiner

*Primary Examiner* — Lynda Salvatore
(74) *Attorney, Agent, or Firm* — McDonald Hopkins LLC

(57) ABSTRACT

The present invention provides a process for preparing a pre-treated low Dk-type glass fabric for constituting a circuit board, comprising pre-treating low Dk-type glass fabric with a pre-treating varnish having a Dk close to the Dk of the used low Dk-type glass fabric at different temperatures and having a small Df. The present invention further provides a bonding sheet and a circuit board prepared thereby. The circuit boards prepared by the preparation process of the present invention have a Dk having small differences in warp and weft directions, and can effectively solve the problem of signal propagation delay. The circuit boards have a small Df, so as to have a small signal loss. Meanwhile, the cured, partially-cured or uncured dry glue obtained after drying the solvent of the pre-treating varnish has similar dielectric properties at different temperatures to the used low Dk-type glass fabric, so that the circuit boards have a very small signal propagation delay at different temperatures.

21 Claims, No Drawings

CIRCUIT BOARD AND PROCESS FOR PREPARING THE SAME

CROSS-REFERENCE TO RELATED APPLICATION

This application is a 35 U.S.C. 371 national stage filing of PCT Application No. PCT/CN2015/096520, filed on Dec. 7, 2015, which claims priority to Chinese Patent Application No. 201510546802.7, filed on Aug. 28, 2015, both of which are incorporated herein in their entirety by reference.

TECHNICAL FIELD

The present invention belongs to the technical field of electronic materials, and relates to a circuit board and a process for preparing the same, specifically to a microhomogeneous and isotropous circuit board and a process for preparing the same. More specifically, the present invention relates to a circuit board having less dielectric constant difference in the warp and weft directions at different temperatures and having less dielectric loss, as well as a process for preparing the same.

BACKGROUND ART

In recent years, circuit boards are being developed in the direction of multiple stratification, high-density wiring and high-speed signal transmission with the development of electronic products in the direction of multifunction and miniaturization, which puts higher requirements on the overall performances of circuit boards (metal clad laminates, e.g. copper clad laminates). Specifically, the dielectric constant (Dk) and dielectric loss (Df) of medium are important indexes for affecting signal transmission rate and signal quality. As for the transmission rate, the lower the dielectric constant of the medium materials is, the faster the transmission rate of signals is. As for signal integrity, the dielectric loss property of materials results in signal loss during the transmission, and the signal loss sharply increases along with the increases of transmission frequency and transmission line length. As for substrates, the signal integrity is primarily relevant to the dielectric loss of dielectric materials and the surface roughness of the copper foil conductors. The lower the dielectric loss of the dielectric materials is, the less the signal transmission loss is, especially and prominently during high frequency and long link transmission.

Meanwhile, as the information and communication equipments develop in the direction of high performance, high function and networking, data transmission rate will become higher and faster in the cloud computing and big data era. The data transmission rate is increased from the conventional 5 Gbps to 10 Gbps, even 25 Gbps. When the data transmission rate becomes higher, the transmission wavelength of digital signals becomes shorter. When the transmission rate is lower, the signal propagation delay has less effect on the signal integrity since the digital signal has a longer transmission wavelength; when the transmission rate is higher than 10 Gbps, signal propagation delay becomes one problem that must be considered in the high-speed transmission link.

Copper clad laminates as one of the carriers for transmitting signals from communication equipments play a key role during the signal transmission, and the laminate materials as the transmission medium decide the quality of signal transmission. At present, electronic grade glass fabrics are generally used in copper clad laminate materials as reinforcing materials, which are obtained by impregnating with thermosetting resins, drying, laminating and hot-pressing. Since woven materials are used as the reinforcing materials (e.g. glass fabrics), the knitting and the presence of cross nodes at the cross section of woven fibers of woven fiber cloth result in uneven distribution of insulating medium (e.g. glass ingredient) in circuit boards.

In order to solve such problem, dielectric materials which are homogeneous in the plane direction shall be prepared fundamentally. The main technical means comprise (1) increasing the splitting extent of glass fabrics; (2) replacing fiber woven materials with reinforcing materials in a film form; (3) using reinforcing materials having a lower dielectric constant, e.g. glass fabrics having a low dielectric constant. Although the splitting makes glass fabrics further homogeneous, only weft-direction homogeneity can be achieved due to the weaving process and the structure of glass fabrics at present. In the warp-direction, it is looser only than conventional non-splitting fiber cloths, and complete splitting and homogenization cannot be achieved, which causes that glass fabrics cannot achieve complete homogeneity in the plane direction. There are great difficulties in the process implementation by using the film form, e.g. worse operability, worse binding to resins, being easy to delamination and the like. Although glass fabrics having a low dielectric constant may reduce the dielectric constant of the reinforcing materials to some extent, they are greatly different from the resin composition having a low dielectric constant used at present, so that they cannot meet the uniformity of dielectric constant in the plane direction.

In order to adapt the technical requirements of high speed communication on copper clad laminate materials, so far, those skilled in the art devote to reduce the dielectric constant and dielectric loss by various technical means via the following two aspects: replacing conventional epoxy resins with modified epoxy resins, cyanate ester resins, bismaleimide resins, polyphenyl ether resins, hydrocarbon resins, as well as thermoplastic materials—polytetrafluoroethylene, liquid crystal resins and the like. These resin materials themselves have the properties of very low dielectric constants and dielectric losses, and can provide better high-speed transmission performance. In addition, to change the reinforcing materials may reduce the dielectric constant and dielectric loss of the copper clad laminate materials. Since the current general reinforcing materials are electronic grade glass fabrics (E-type glass fabrics) and have a dielectric constant of 6.2-6.6 which is far higher than that of the resin portion used therein, the copper clad laminate materials prepared thereby generally have a Dk of 3.5-4.5. In order to further reduce the dielectric constant of laminate materials, those skilled in the art replace conventional electronic grade glass fabrics with glass fabrics having a low dielectric constant. Since glass fabrics having a low dielectric constant have a Dk of 4.4-4.6, they can greatly reduce the dielectric constant of the whole laminate materials and effectively increase the transmission rate of signals. Moreover, the Df value thereof is lower than that of the electronic grade glass fabrics, glass fabrics having a low dielectric constant are beneficial to improve the signal loss during the transmission process and notably improve the signal integrity brought by the increases of the signal transmission rate and frequency.

It can be seen from the above that the resin composition and reinforcing material are two essential ingredients of the copper-clad laminate materials. The difference of the dielectric constants of these two components reflects that the Dk of the reinforcing material is far higher than that of the resin composition as specifically shown in the following table.

| Ingredients | Dielectric constant |
| --- | --- |
| Epoxy resin | 3.5-3.9 |
| Cyanate | 2.8-3.2 |
| Bismaleimide | 3.0-3.5 |
| Polyphenyl ether | 2.4-2.6 |
| Hydrocarbon resin | 2.2-2.6 |
| polytetrafluoroethylene | 2.2-2.4 |
| Liquid crystal resin | 2.2-2.6 |
| Glass fabric in electronic grade | 6.2-6.6 |
| Glass fabric with low dielectric constant | 4.4-4.6 |
| Quartz glass fiber cloth | 3.8-4.0 |

It can be obviously seen according to the table above that the dielectric constant of the resin composition used for high-speed materials is apparently lower than that of the reinforcing material-glass fabrics, and the dielectric constant of the final laminates is the weighted sum of those of the resin composition and reinforcing material as shown in the following formula.

$$Dk_{laminate} = Dk_{resin} \times V_{resin} + Dk_{reinforcing\ material} \times V_{reinforcing\ material}$$

$Dk_{laminate}$: dielectric constant of the laminate material;
$Dk_{resin}$: dielectric constant of the resin;
$V_{resin}$: volume parts of the resin;
$Dk_{reinforcing\ material}$: dielectric constant of the reinforcing material; and
$V_{reinforcing\ material}$: volume parts of the reinforcing material.

It can be easily seen from the microstructure that, due to the microinhomogeneity of the knitting structure of the reinforcing material, the copper clad laminates composed of the resin composition and reinforcing material have a very high Dk at the interlaced places of warp and weft yarns, a higher Dk at places where there are warp or weft yarns, and a low Dk at places where there are no yarns. Such inhomogeneity results in microdifference of dielectric constants of dielectric layers.

The transmission time of signals is determined by the transmission rate and distance. When the transmission distances are the same, the transmission rate is inversely proportional to the dielectric constant of the transmission medium. The microdifference of dielectric constants of the surrounding medium corresponding to the transmission lines directly results in time inconsistency of signals from the emitting end to the receiving end, mismatching of signals, i.e. propagation delay effect. Propagation delay of signals is divided into warp-wise propagation delay and weft-wise propagation delay, wherein warp-wise propagation delay refers to the propagation delay of signals when the transmission lines are wired in the warp direction of the circuit boards; and weft-wise propagation delay refers to the propagation delay of signals when the transmission lines are wired in the weft direction of the circuit boards.

In conclusion, propagation delay has become a problem which signal transmission has to face in high-speed link circuit with the continuous increase of data transmission rate. Currently, the production of propagation delay may be decreased by some designing means to some extent, which, however, will increase the cost greatly. Thus how to increase the microhomogeneity of the dielectric materials-laminates from the start of the dielectric materials themselves and to solve the propagation delay problem of signals fundamentally has become one important technical problem in the researches on high-speed material technology.

As stated above, the structural characteristics of the current reinforcing materials result in inhomogeneity in the plane direction of laminate materials, so that the dielectric constants and losses of laminate materials are anisotropic in the microstructure. Moreover, there is also a great microstructural difference at different places in the same plane direction. During the designing process of high-speed digital circuits, engineers take various measures to solve the problem of signal integrity, one of which is the method of transmitting high-speed digital signal by differential lines. Differential lines in PCB are coupled strip lines or coupled microstrip lines, and it is odd mode transmission when signals are transmitted thereon. Thus differential signals have the advantages of strong anti-interference and being easy to match. With the increase of the requirements on information transmission rate of digital circuits, the differential transmission mode of signals will be widely applied. Differential lines have the following main advantages of strong anti-interference, effectively inhibiting electromagnetic interference, precise timing positioning. By transmitting high-speed signals with differential lines, it is beneficial to the signal integrity and low power consumption of the PCB system on one hand, and it puts higher requirements on the PCB designing level on the other hand.

Meanwhile, the application environment of high-speed digital circuits changes a lot. In the freezing cold zones and the extremely hot zones, there is a great difference in the environment temperature. Different temperatures result in instability of Dk and Df of circuit boards. At different temperatures, the instability of Dk and Df of circuit boards is mainly reflected in (1) Dk increases along with the increase of the temperature; (2) Df increases along with the increase of the temperature. Therefore, it is more than solving the signal propagation delay problem at a certain temperature. More importantly, the signal propagation delay problem can still be solved when the temperature changes.

CN102548200A discloses a circuit board, comprising glass films forming rough layers by surface roughening treatment, resin bonding layers respectively located on the rough layers on two sides of the glass films, and metal foils on outer side of the resin bonding layers, wherein the glass films, resin bonding layers and metal foils are bonded together by pressing. Glass films are easily broken when being pressed. Moreover, the surface roughening treatment of glass films is complex and hard to control. Meanwhile, the roughening treatment will damage the isotropous feature of glass films to some extent. In addition, the production process by using glass films is different from that of conventional copper clad laminates, and equipment upgrading and adjustment are required.

EP1140373A discloses impregnating glass fabrics with a solution having a relatively low solid content and containing curable resins, drying and impregnating with a solution having a relatively high solid content and containing curable resins, then curing, increasing solvent content by reducing the solid content of the resin solution and decreasing the viscosity, which aim to increase the permeability of resins and reducing the pore amount of prepregs and cured articles. However, it is not mentioned therein how to decrease Dk and solve the signal propagation delay problem.

CN101494949A discloses splitting or flattening glass fabrics before the sizing of glass fabrics, impregnating in epoxy resin varnish, drying to prepare insulating material layer, so as to decrease signal loss of copper clad laminate and increase the signal transmission rate and reduce the product cost. However, the signal propagation delay in the plane direct, i.e. warp- and weft-directions, of circuit boards, is not simply or conveniently solved in conventional production processes.

CN101570640B discloses preparing a prepreg by using quartz glass fabrics (preferably splitting) having a sparse intensity of quartz glass fibers as the substrate and impregnating with a thermosetting resin composition having a dielectric loss of 0.003 or less. While ensuring the dielectric constant by applying in high frequency materials, the processability thereof is improved. However, the signal propagation delay in the plane direct, i.e. warp- and weft-directions, of circuit boards, is not simply or conveniently solved in conventional production processes.

CN103755989A discloses a process for preparing bonding sheets for composing circuit boards, comprising preparing a pre-treating varnish having a Dk same as or close to that of the reinforcing material used therein; then pre-impregnating the reinforcing material in the pre-treating varnish, drying solvent to obtain a pre-treated reinforcing material; finally mainly impregnating the pre-treated reinforcing material in the pre-treating varnish, and then drying solvent to obtain bonding sheets. The Dk and Df values of the sheets are measured at a frequency of 10 GHz and an environment temperature which is normal temperature (23±2° C.). At the specific using temperature, the signal propagation delay problem may be solved. However, the solution is not provided for the signal propagation delay at different temperatures, i.e. the Dk and Df of circuit boards change at different temperatures.

CN201410016714.1 discloses a process for preparing bonding sheets and circuit boards, comprising a pre-impregnating step of pre-impregnating the varnish having the same DK, so as to better solve the problem of uniformity of the dielectric constants. However, since common varnishes have different Dks at different temperatures, there still exists the signal propagation delay problem when the temperature varies.

DISCLOSURE OF THE INVENTION

In order to rectify the defects in the prior art, the inventor found during the research that circuit boards had a very low signal propagation delay at different temperatures (from −55° C. to 85° C.) when the following technical solution was used.

The pre-treating varnish has close dielectric properties to Low Dk-type glass fabric, which means that the Dk of the cured, partially-cured or uncured dry glue obtained after drying solvent of the pre-treating varnish is close to the Dk of the used Low Dk-type glass fabric. Moreover, the variation trends or rangeabilities of the Dks thereof are close at different temperatures.

In order to achieve the aforesaid object, the following technical solution was used.

On the first aspect, the present invention provides a process for preparing a pre-treated low Dk-type glass fabric for constituting circuit boards, comprising:

(1) preparing a pre-treating varnish, wherein the pre-treating varnish has a dielectric constant Dk having a difference of ±5% from that of the low Dk-type glass fabric to be used at different temperatures (from −55° C. to 85° C.), and has a dielectric loss Df of 0.007 or less (10 GHz) at different temperatures (from −55° C. to 85° C.); and (2) pre-impregnating the low Dk-type glass fabric in the pre-treating varnish obtained in step (1), then drying solvent to obtain a pre-treated low Dk-type glass fabric having a Dk of 5.0 or less (10 GHz).

In one preferred embodiment, the pre-treating varnish has a Df of 0.005 or less (10 GHz) at different temperatures (from −55° C. to 85° C.).

In one embodiment, the pre-treating varnish is a varnish obtained by dissolving a resin composition in an organic solvent, wherein the resin composition comprises a resin, a suitable amount of a curing agent, a first component filler, and a second component filler, and the nonvolatile ingredients are based on parts by mass, wherein the resin and curing agent are in an amount of 40 parts by mass; the first component filler and second component filler are in an amount of from 45 to 60 parts by mass.

In one embodiment, the resin is one selected from the group consisting of polyphenyl ether resin having unsaturated double bonds, polybutadiene resin, polybutadiene copolymer resin, elastomer block copolymer, or a mixture of at least two selected therefrom;

the polyphenyl ether resin having unsaturated double bonds is one selected from the group consisting of polyphenyl ether resin having two terminal modifying groups being acryloyl groups, polyphenyl ether resin having two terminal modifying groups being styryl groups and polyphenyl ether resin having two terminal modifying groups being vinyl groups, or a mixture of at least two selected therefrom;

the polybutadiene resin is one selected from the group consisting of 1,2-polybutadiene resin, polybutadiene resin modified with maleic anhydride, polybutadiene resin modified with acrylate, epoxy-modified polybutadiene resin, amino-modified polybutadiene resin, polybutadiene resin modified with terminal carboxyl group and polybutadiene resin modified with terminal hydroxyl group, or a mixture of at least two selected therefrom;

the polybutadiene copolymer resin is one selected from the group consisting of polybutadiene-styrene copolymer resin, polybutadiene-styrene-divinyl benzene-grafted copolymer resin, styrene-butadiene copolymer resin modified with maleic anhydride, and styrene-butadiene copolymer resin modified with acrylate, or a mixture of at least two selected therefrom; and the elastomer block copolymer is one selected from the group consisting of styrene-butadiene diblock copolymer, styrene-butadiene-styrene triblock copolymer, styrene-(ethylene-butylene)-styrene triblock copolymer, styrene-isoprene diblock copolymer, styrene-isoprene-styrene triblock copolymer, styrene-(ethylene-propylene)-styrene triblock copolymer, and styrene-(ethylene-butylene) diblock copolymer, or a mixture of at least two selected therefrom.

In one embodiment, the first component filler is one selected from the group consisting of titanium dioxide, calcium titanate, strontium titanate, or a mixture of at least two selected therefrom; the second component filler is one selected from the group consisting of alumina, magnesium oxide, magnesium titanate, or a mixture of at least two selected therefrom, wherein the first and second component fillers have a mass ratio of 1:(0.5-2.0);

the curing agent is one selected from the group consisting of organic peroxide free radical initiator, carbon free radical initiator, or a mixture of at least two selected therefrom; and the organic solvent is one selected from the group consisting of aromatic hydrocarbon solvents such as toluene, xylol and mesitylene, or a mixture of at least two selected therefrom.

In one embodiment, the pre-treating varnish has a Dk which is ±0.1 (10 GHz) of that of the low Dk-type glass fabric.

In one embodiment, the main resin varnish is a varnish obtained by dissolving a resin composition in an organic solvent;

the resin composition comprises a resin, a filler and a curing agent;

the resin is one selected from the group consisting of polyphenyl ether resin having unsaturated double bonds, polybutadiene resin, polybutadiene copolymer resin, elastomer block copolymer, dicyclopentadiene novolac epoxy resin and cyanate ester resin, or a mixture of at least two selected therefrom;

the filler is one selected from the group consisting of silica, glass dust, aluminum nitride, boron nitride and aluminum hydroxide, or a mixture of at least two selected therefrom, wherein said silica comprises molten silica and crystalline silica, preferably molten silica;

the curing agent is one selected from the group consisting of macromolecular anhydride curing agent, active ester, organic peroxide free radical initiator and carbon free radical initiator, or a mixture of at least two selected therefrom;

the organic peroxide free radical initiator is one selected from the group consisting of dicumyl peroxide, 1,3-bi(tertiary-butyl-peroxy isopropyl)benzene, 2,5-di-t-butyl-peroxy-2,5-dimethylhexane, 2,5-di-t-butyl-peroxy-2,5-dimethyl-hexyne-3, di-t-butyl-peroxide, t-butyl cumyl peroxide, or a mixture of at least two selected therefrom; and the carbon free radical initiator is one selected from the group consisting of 2,3-dimethyl-2,3-diphenylbutane, 2,3-dimethyl-2,3-di(4-methylphenyl)butane, 2,3-dimethyl-2,3-di(4-isopropyl-phenyl)butane, 3,4-dimethyl-3,4-diphenyl hexane, or a mixture of at least two selected therefrom.

In one embodiment, the low Dk-type glass fabric is preferably NE glass fabric;

the pre-treated NE glass fabric has a resin content of from 20 wt. % to 50 wt. %;

when the NE glass fabric has a mass area ratio of less than 30 g/m$^2$, the pre-treated NE glass fabric has a resin content of from 25 wt. % to 50 wt. %;

when the NE glass fabric has a mass area ratio of from 30 g/m$^2$ to 100 g/m$^2$, the pre-treated NE glass fabric has a resin content of from 20 wt. % to 45 wt. %; and when the NE glass fabric has a mass area ratio of from 100 g/m$^2$ to 175 g/m$^2$, the pre-treated NE glass fabric has a resin content of from 20 wt. % to 40 wt. %.

On the second aspect, the present invention provides a pre-treated low Dk-type glass fabric prepared according to the process of the present invention.

On the third aspect, the present invention provides a bonding sheet or a laminate prepared from the pre-treated low Dk-type glass fabric of the present invention.

In one embodiment, the pre-treated low Dk-type glass fabric of the present invention is mainly impregnated in a main resin varnish, and then solvent is dried to obtain a bonding sheet.

The main resin varnish is a varnish obtained by dissolving a resin composition in an organic solvent;

the resin composition comprises a resin, a filler and a curing agent;

the resin is one selected from the group consisting of polyphenyl ether resin having unsaturated double bonds, polybutadiene resin, polybutadiene copolymer resin, elastomer block copolymer, dicyclopentadiene novolac epoxy resin and cyanate ester resin, or a mixture of at least two selected therefrom;

the filler is one selected from the group consisting of silica, glass dust, aluminum nitride, boron nitride and aluminum hydroxide, or a mixture of at least two selected therefrom, wherein said silica comprises molten silica and crystalline silica, preferably molten silica;

the curing agent is one selected from the group consisting of macromolecular anhydride curing agent, active ester, organic peroxide free radical initiator and carbon free radical initiator, or a mixture of at least two selected therefrom;

the organic peroxide free radical initiator is one selected from the group consisting of dicumyl peroxide, 1,3-bi(tertiary-butyl-peroxy isopropyl)benzene, 2,5-di-t-butyl-peroxy-2,5-dimethylhexane, 2,5-di-t-butyl-peroxy-2,5-dimethyl-hexyne-3, di-t-butyl-peroxide, t-butyl cumyl peroxide, or a mixture of at least two selected therefrom; and the carbon free radical initiator is one selected from the group consisting of 2,3-dimethyl-2,3-diphenylbutane, 2,3-dimethyl-2,3-di(4-methylphenyl)butane, 2,3-dimethyl-2,3-di(4-isopropyl-phenyl)butane, 3,4-dimethyl-3,4-diphenyl hexane, or a mixture of at least two selected therefrom.

In another embodiment, metal substrates are superimposed at no, one or both sides of one or more sheets of the pre-treated low Dk-type glass fabric to obtain a laminate.

The laminate further comprises a resin film layer between the pre-treated low Dk-type glass fabric and the metal substrates.

In yet another embodiment, resin-covered copper foils are superimposed at one or both sides of one or more sheets of the pre-treated low Dk-type glass fabric to obtain a laminate.

The laminate further comprises a resin film layer between the pre-treated low Dk-type glass fabric and the resin-covered copper foils.

In one embodiment, resin film layers are superimposed at one or both sides of one or more sheets of the pre-treated low Dk-type glass fabric to obtain a laminate.

On the fourth aspect, the present invention provides a circuit board prepared from the bonding sheet.

On the fifth aspect, the present invention provides a printed circuit board prepared from the bonding sheet, laminate or circuit board of the present invention.

As compared to the prior art, the present invention has the following beneficial effects.

(1) As compared to using glass film plate, the circuit board of the present invention uses bonding sheets mainly impregnated, wherein the manufacturing process is completely the same as that of conventional copper clad laminate without any device upgrading or adjustment. Meanwhile, there is no crushing during the pressing of the substrates, and the interlaminar adhesive force is greatly increased.

(2) As compared to using fiber cloth, the circuit board of the present invention has the advantage of low cost. Moreover, the circuit board has the advantage of less warp-wise and weft-wise difference in dielectric constant, and can solve the problem of signal propagation delay when applied in high frequency field.

(3) The circuit board of the present invention has less warp-wise and weft-wise difference in Dk, and can solve the problem of signal propagation delay. Meanwhile, the circuit board has a less Df, so as to result in a less signal loss.

(4) The Dk and Df of the circuit board of the present invention both have a better stability at different temperatures. Most importantly, the cured, partially-cured or uncured dry glue obtained after drying solvent of the pre-treating varnish has a Dk close to that of the low Dk-type glass fabric at different temperatures (from −55° C. to 85° C.), so that the circuit board has a very small signal propagation delay at different temperatures.

EMBODIMENTS

The present invention is detailedly stated as follows.

Dk of the present invention refers to the dielectric constant measured by the SPDR method at 10 GHz and a temperature of −55° C., −25° C., 0° C., 25° C., 50° C. and 85° C.

Df of the present invention refers to the dielectric loss measured by the SPDR method at 10 GHz and a temperature of −55° C., −25° C., 0° C., 25° C., 50° C. and 85° C.

The temperature coefficient of dielectric constant of the present invention refers to the relative average rate of change of the dielectric constant when the temperature increases by 1° C. within a certain temperature range, which is normally from −25 to +85° C., or from −55 to +125° C. The common unit thereof is $10^{-6}/°$ C. or ppm/° C. The coefficient is an important electrical parameter of the materials, and can be based for classifying lots of ceramic dielectric materials, i.e. materials of positive, negative or zero temperature coefficient. The materials having different dielectric constant temperature coefficients may have different uses.

The glass fabrics of the present invention refer to the glass fabrics, including E-type glass fabrics, NE-type glass fabrics, S-type glass fabrics, D-type glass fabrics, L-type glass fabrics and the like, each of which have specification models of 7628, 2116, 1080, 106, 1037, 1078, 2112, 3313, 1500 and so on. Those skilled in the art will know that glass fabrics are mainly used as the reinforcing materials of circuit boards when applied in the circuit board field.

The low Dk-type glass fabrics of the present invention specifically refer to those having a Dk of 5.0 or less, preferably NE-type glass fabrics.

The resin composition of the present invention refers to a composition comprising resins and curing agents. For example, polybutadiene resin composition is a composition comprising polybutadiene resin and suitable curing agents. Those skilled in the art can choose suitable curing agents and amount thereof according to the resins used therein, and can also choose suitable organic solvents according to the resins and curing agents used therein.

The filler of the present invention refers to filling materials or fillers. Besides reducing the cost, to use fillers in the copper clad plate industry is to increase the performances of the copper clad plates, e.g. decrease of CTE, increase of flame retardancy, increases of thermal conductivity and mechanical properties of plates. With the development of filler technology, more new types of fillers are used in copper clad plates, e.g. functional fillers of the present invention for adjusting Dk of the pre-treating varnish.

The pre-treating varnish refers to a varnish obtained by dissolving the resin composition of the present invention in a suitable organic solvent. Preferably, the pre-treating varnish of the present invention refers to a dispersion system obtained by dissolving the resin composition of the present invention in a suitable organic solvent and then adding fillers. Those skilled in the art can adjust the amount of the fillers in the pre-treating varnish so as to make the pre-treating varnish have a suitable Dk. In the present invention, Dk of the pre-treating varnish is Dk of the cured, partially-cured or uncured dry glue in which the solvent is removed, which is merely relevant to the amounts of the resin composition and filler, rather than the amount of the solvent.

The impregnation of the present invention refers to the operations of impregnating the glass fabrics into a varnish and then drying solvent by using a gluing machine.

The pre-impregnation of the present invention refers to the operations of impregnating the glass fabrics into a prefabricated varnish and then drying solvent by using a gluing machine.

The main-impregnation of the present invention refers to the operations of impregnating the glass fabrics into a main varnish and then drying solvent by using a gluing machine.

The resin content of the present invention refers to the mass percent of the solid composition including the resin, besides the reinforcing material—glass fabrics, in the pre-treated low Dk-type glass fabric, bonding sheet and circuit board. For example, when the resin composition formula of the varnish comprises resins, curing agents and fillers, the resin content refers to the mass percent of the resins, curing agents and fillers. The resin content is a fixed term in the art. Those skilled in the art know that the resin content can be controlled by adjusting the processing parameters in combination of the solid content of the pre-treating varnish, such as intervals of clamp shafts of the gluing machine during the sizing, the sizing speed of the gluing machine and so on.

The pre-treatment of the current low Dk-type glass fabrics specifically includes pre-treating the low Dk-type glass fabrics with a pre-treating varnish having a Dk equivalent in the properties to the low Dk-type glass fabrics and good matching properties, filling the grids and intervals of the low Dk-type glass fabrics as the basic controlling object so as to make less Dk difference in the warp and weft directions, and forming the semi-product of the reinforcing materials for the main impregnation, i.e. the pre-treated low Dk-type glass fabrics.

The process of the present invention primarily comprises two steps detailedly and respectively as follows.

Step (1)

Preparing a pre-treating varnish, wherein the cured, partially-cured or uncured dry glue obtained by drying solvent of the pre-treating varnish has a Dk close to (having a difference of ±5%) that of the NE-type glass fabric to be used at different temperatures (from −55° C. to 85° C.); the dry glue has a Dk of 4.4-4.6 (10 GHz), and a Df of 0.007 or less (10 GHz), preferably a Df of 0.005 or less (10 GHz), more preferably a Df of 0.003 or less (10 GHz) at different temperatures (from −55° C. to 85° C.).

According to the present invention, the NE-type glass fabrics are electronic-grade glass fabrics, primarily comprising from 50 wt. % to 70 wt. % $SiO_2$, from 0 wt. % to 10 wt. % CaO, from 10 wt. % to 15 wt. % $Al_2O_3$, from 15 wt. % to 20 wt. % $B_2O_3$, from 0 wt. % to 5 wt. % MgO, from 0.5 wt. % to 5 wt. % $TiO_2$, from 0 wt. % to 1 wt. % $Na_2O$ and $K_2O$.

By screening and studying relevant reinforcing materials, the inventor found that Dk and Df of the circuit boards may reach a lower level by using the NE-type electronic-grade glass fabrics as the reinforcing material as compared to other reinforcing materials. Dk and Df are important indexes of affecting the signal transmission rate and signal quality. As for the transmission rate, the lower the Dk value is, the faster the transmission rate of signals is. As for the signal integrity, the lower the Df value is, the less the signal loss during the transmission is. The NE-type glass fabrics have a Dk of from 4.4 to 4.6 (10 GHz) at different temperatures (from −55° C. to 85° C.) and a Df of 0.007 or less (10 GHz) at different temperatures (from −55° C. to 85° C.).

According to the present invention, the pre-treating varnish is a varnish obtained by dissolving a resin composition in an organic solvent.

The resin composition comprises a resin, a suitable amount of curing agent, a first component filler, and a second component filler, and the nonvolatile ingredients are based on parts by mass, wherein the resin and curing agent are in an amount of 40 parts by weight; the first component filler and second component filler are in an amount of from 45 to 60 parts by weight.

The resin is one selected from the group consisting of polyphenyl ether resin having unsaturated double bonds, polybutadiene resin, polybutadiene copolymer resin, elastomer block copolymer, or a mixture of at least two selected therefrom.

According to the present invention, the polyphenyl ether resin having unsaturated double bonds is one selected from the group consisting of polyphenyl ether resin having two terminal modifying groups being acryloyl groups, polyphenyl ether resin having two terminal modifying groups being styryl groups and polyphenyl ether resin having two terminal modifying groups being vinyl groups, or a mixture of at least two selected therefrom.

According to the present invention, the polybutadiene resin is one selected from the group consisting of 1,2-polybutadiene resin, polybutadiene resin modified with maleic anhydride, polybutadiene resin modified with acrylate, epoxy-modified polybutadiene resin, amino-modified polybutadiene resin, polybutadiene resin modified with terminal carboxyl group and polybutadiene resin modified with terminal hydroxyl group, or a mixture of at least two selected therefrom.

According to the present invention, the polybutadiene copolymer resin is one selected from the group consisting of polybutadiene-styrene copolymer resin, polybutadiene-styrene-divinyl benzene-grafted copolymer resin, styrene-butadiene copolymer resin modified with maleic anhydride, and styrene-butadiene copolymer resin modified with acrylate, or a mixture of at least two selected therefrom.

According to the present invention, the elastomer block copolymer is one selected from the group consisting of styrene-butadiene diblock copolymer, styrene-butadiene-styrene triblock copolymer, styrene-(ethylene-butylene)-styrene triblock copolymer, styrene-isoprene diblock copolymer, styrene-isoprene-styrene triblock copolymer, styrene-(ethylene-propylene)-styrene triblock copolymer, and styrene-(ethylene-butylene)diblock copolymer, or a mixture of at least two selected therefrom.

By studies, the inventor found that the aforesaid resin system having a low polarity can reduce the polarization, so as to finally achieve the object of decreasing Df.

According to the present invention, the first component filler is one selected from the group consisting of titanium dioxide, calcium titanate, strontium titanate, or a mixture of at least two selected therefrom, wherein said titanium dioxide comprises rutile and anatase titanium dioxides, preferably rutile titanium dioxide.

According to the present invention, the second component filler is one selected from the group consisting of alumina, magnesium oxide, magnesium titanate, or a mixture of at least two selected therefrom.

By studies, the inventor found that the temperature coefficient of dielectric constant of the first component filler is negative, and the temperature coefficient of dielectric constant of the second component filler is positive. By combining the two fillers together in a certain ratio, the Dk stability at different temperatures may be achieved.

Preferably, the first and second component fillers have a mass ratio of 1:(0.5-2.0), e.g. 1:0.5, 1:0.6, 1:0.8, 1:0.9, 1:1.2, 1:1.5, 1:1.7, 1:1.8 and 1:2.0.

By conducting a great deal of experimental researches on the amount ratio of the first and second component fillers, the inventor found that, for the temperature coefficient of dielectric constant after the first and second component fillers are mixed, the smaller is not the better. It is better that the temperature coefficient of dielectric constant of the resin composition as a whole consisting of the first component filler, the second component filler, resin and curing agent is close to that of the NE-type glass fabrics, which ensures that the Dk of the resin composition as a whole is close to that of the NE-type glass fabrics, and their variation tendencies or changes are also close at different temperatures, so as to solve the problem of signal propagation delay of circuit boards at different temperatures.

According to the present invention, the curing agent is one selected from the group consisting of organic peroxide free radical initiator and carbon free radical initiator, or a mixture of at least two selected therefrom.

According to the present invention, the organic peroxide free radical initiator is one selected from the group consisting of dicumyl peroxide, 1,3-bi(tertiary-butyl-peroxy isopropyl)benzene, 2,5-di-t-butyl-peroxy-2,5-dimethylhexane, 2,5-di-t-butyl-peroxy-2,5-dimethyl-hexyne-3, di-t-butyl-peroxide, of at least two, or a mixture of at least two selected therefrom.

According to the present invention, the carbon free radical initiator is one selected from the group consisting of 2,3-dimethyl-2,3-diphenylbutane, 2,3-dimethyl-2,3-di(4-methylphenyl)butane, 2,3-dimethyl-2,3-di(4-isopropyl-phenyl) butane, 3,4-dimethyl-3,4-diphenylhexane, or a mixture of at least two selected therefrom.

According to the present invention, the organic solvent is one selected from the group consisting of aromatic hydrocarbon solvents such as toluene, xylol and mesitylene, or a mixture of at least two selected therefrom.

Step (2)

Pre-impregnating the NE-type glass fabrics in the pre-treating varnish, then drying solvent to obtain a pre-treated NE-type glass fabrics.

According to the present invention, the main resin varnish is a varnish obtained by dissolving a resin composition in an organic solvent.

The resin composition comprises a resin, a filler and a curing agent.

According to the present invention, the resin is one selected from the group consisting of polyphenyl ether resin having unsaturated double bonds, polybutadiene resin, polybutadiene copolymer resin, elastomer block copolymer, dicyclopentadiene novolac epoxy resin and cyanate ester resin, or a mixture of at least two selected therefrom.

According to the present invention, the filler is one selected from the group consisting of silica, glass dust, aluminum nitride, boron nitride and aluminum hydroxide, or a mixture of at least two selected therefrom, wherein said silica comprises molten silica and crystalline silica, preferably molten silica.

According to the present invention, the curing agent is one selected from the group consisting of macromolecular anhydride curing agent, active ester, organic peroxide free radical initiator and carbon free radical initiator, or a mixture of at least two selected therefrom.

According to the present invention, the cured, partially-cured or uncured dry glue obtained by drying solvent of the pre-treating varnish has a Dk close to (having a difference of ±5%) that of the NE-type glass fabric at different temperatures (from −55° C. to 85° C.); the dry glue has a Dk of 4.4-4.6 (10 GHz), and a Df of 0.007 or less (10 GHz), preferably a Df of 0.005 or less (10 GHz), more preferably a Df of 0.003 or less (10 GHz) at different temperatures (from −55° C. to 85° C.). The less the Df of the dry glue is, the less the signal loss of circuit boards is.

According to the present invention, the pre-treating varnish is a varnish obtained by dissolving a resin composition in an organic solvent.

The resin composition comprises a resin, a first component filler, a second component filler, and a curing agent.

The resin is one selected from the group consisting of polyphenyl ether resin having unsaturated double bonds, polybutadiene resin, polybutadiene copolymer resin, elastomer block copolymer, or a mixture of at least two selected therefrom.

The first component filler is one selected from the group consisting of titanium dioxide, calcium titanate, strontium titanate, or a mixture of at least two selected therefrom, wherein said titanium dioxide comprises rutile and anatase titanium dioxides, preferably rutile titanium dioxide.

The second component filler is one selected from the group consisting of alumina, magnesium oxide, magnesium titanate, or a mixture of at least two selected therefrom.

The first and second component fillers have a mass ratio of 1:(0.5-2.0).

The curing agent is one selected from the group consisting of organic peroxide free radical initiator, carbon free radical initiator, or a mixture of at least two selected therefrom.

The organic solvent is one selected from the group consisting of aromatic hydrocarbon solvents such as toluene, xylol and mesitylene, or a mixture of at least two selected therefrom.

According to the present invention, the NE-type glass fabrics are electronic-grade glass fabrics, primarily comprising from 50 wt. % to 70 wt. % $SiO_2$, from 0 wt. % to 10 wt. % CaO, from 10 wt. % to 15 wt. % $Al_2O_3$, from 15 wt. % to 20 wt. % $B_2O_3$, from 0 wt. % to 5 wt. % MgO, from 0.5 wt. % to 5 wt. % $TiO_2$, from 0 wt. % to 1 wt. % $Na_2O$ and $K_2O$.

According to the present invention, the NE-type glass fabrics are pre-treated, and the cured, partially-cured or uncured dry glue after drying solvent of the pre-treating varnish has a Dk of 4.4-4.6 (10 GHz).

According to the present invention, the NE-type glass fabrics have a resin content of from 20 wt. % to 50 wt. % after the pre-treatment.

If the resin content is too high, the pre-impregnating varnish will be dissolved and mixed with the main impregnating varnish after the main impregnation, which will affect the sizing amount of the main impregnation. The resin content is too low to fill out the pores of the glass fabric, so that the consistency of dielectric constants in warp- and weft-directions cannot be realized, so as to affect the signal transmission propagation delay.

According to the present invention, when the pre-treated NE glass fabric has a mass area ratio of less than 30 g/m², the pre-treated NE glass fabric has a resin content of from 25 wt. % to 50 wt. %; when the pre-treated NE glass fabric has a mass area ratio of from 30 to 100 g/m², the resin content of the pre-treated NE glass fabric from 20 wt. % to 45 wt. %; when the pre-treated NE glass fabric has a mass area ratio of from 100 g/m² to 175 g/m², the resin content of the pre-treated NE glass fabric from 20 wt. % to 40 wt. %.

The resin content of the pre-treated NE-type glass fabrics is selected according to the mass area ratio of the NE-type glass fabrics. If the resin content is too high, the pre-treating varnish will be dissolved and mixed with the main impregnating varnish after the main impregnation, so as to affect the sizing amount of the main impregnation. Meanwhile, since the Dk of general glass fabrics is far higher than that of the main impregnating varnish, the Dk of the prepared circuit boards after the main impregnation is too high, and the dielectric performances of circuit boards deteriorate. The resin content is too low to fill out the pores of the glass fabric, so that the microscopic consistency of dielectric constants in warp- and weft-directions cannot be realized, so as to affect the signal transmission propagation delay.

According to the present invention, the pre-treatment of the NE-type glass fabrics comprises drying the organic solvent in the resin varnish. During the drying, the pre-treating varnish on the NE-type glass fabrics may have or have no crosslinking reactions.

In one specific embodiment, the NE-type glass fabrics are pre-treated as follows.

Step 1: Seeking or testing the Dk value (10 GHz) of the NE-type glass fabrics according to the selected NE-type glass fabrics.

Step 2: Preparing a pre-treating varnish according to the Dk value (10 GHz) of the selected NE glass fabrics; the cured, partially-cured or uncured dry glue obtained by drying solvent of the pre-treating varnish has a Dk close to that of the NE-type glass fabric; the dry glue has a Dk of 4.4-4.6 (10 GHz), and a Df of 0.007 or less (10 GHz), preferably a Df of 0.005 or less (10 GHz), more preferably a Df of 0.003 or less (10 GHz).

Step 3: Adjusting according to the mass area ratio of the pre-treated NE glass fabric the processing parameters in combination of the solid content of the pre-treating varnish, such as intervals of clamp shafts of the gluing machine during the sizing, the sizing speed of the gluing machine and so on; when the pre-treated NE glass fabric has a mass area ratio of less than 30 g/m², the pre-treated NE glass fabric has a resin content of from 25 wt. % to 50 wt. %; when the pre-treated NE glass fabric has a mass area ratio of from 30 to 100 g/m², the resin content of the pre-treated NE glass fabric from 20 wt. % to 45 wt. %; when the pre-treated NE glass fabric has a mass area ratio of from 100 g/m² to 175 g/m², the resin content of the pre-treated NE glass fabric from 20 wt. % to 40 wt. %.

Step 4: Drying organic solvent in the pre-impregnated NE-type glass fabrics to obtain a specifically pre-treated NE-type glass fabrics.

The present invention further provides a bonding sheet comprising the aforesaid specifically pre-treated NE-type glass fabrics and the resin composition coated on the specifically pre-treated NE-type glass fabrics.

According to the present invention, the resin composition comprises a resin, a filler and a curing agent.

The resin is one selected from the group consisting of polyphenyl ether resin having unsaturated double bonds, polybutadiene resin, polybutadiene copolymer resin, elastomer block copolymer, dicyclopentadiene novolac epoxy resin and cyanate ester resin, or a mixture of at least two selected therefrom.

The filler is one selected from the group consisting of silica, glass dust, aluminum nitride, boron nitride and aluminum hydroxide, or a mixture of at least two selected therefrom, wherein said silica comprises molten silica and crystalline silica, preferably molten silica.

The curing agent is one selected from the group consisting of macromolecular anhydride curing agent, active ester, organic peroxide free radical initiator and carbon free radical initiator, or a mixture of at least two selected therefrom.

The resin composition of the present invention may be used together with various high polymers as long as they do not damage the intrinsic performances of the resin composition, specifically e.g. liquid crystal polymer, thermosetting resin, thermoplastic resin, different flame retardant compounds or additives which may be used alone or in combination.

In addition, the resin composition may comprise various additives, specifically e.g. antioxidant, heat stabilizer, antistatic agent, UV absorber, pigment, colorant, lubricant, coupling agent, flatting agent, viscosity modifier and the like.

The present invention further provides a circuit board of the bonding sheet of the present invention.

As the typical, but non-limitative examples, the process for preparing the circuit board may include the following steps.

Step 1: Preparing a pre-treating varnish. A pre-treating varnish was prepared according to the Dk of the used NE-type glass fabric, so as to make the Dk of the dry glue obtained after drying solvent of the varnish the same as or close to the Dk of the used NE-type glass fabric.

Step 2: Preparing a pre-treated NE-type glass fabric. A NE-type glass fabric was pre-impregnated with the aforesaid pre-treating varnish; and solvent was dried to obtain a pre-treated NE-type glass fabric.

Step 3: Preparing a bonding sheet. A main resin varnish was prepared to mainly impregnate the aforesaid specially pre-treated NE-type glass fabric. After that, solvent was dried to obtain a bonding sheet.

Step 4: One or more of the aforesaid bonding sheets were superimposed together, and metal foils were superimposed to both sides of the superimposed bonding sheets. The superimposed laminates were hot-pressed in a pressing machine to prepare a circuit board, wherein the curing was carried out at a temperature of 100-400° C. and at a pressure of 10-65 Kgf/cm$^2$ for 1-4 h.

EXAMPLES

In order to better state the present invention and better understand the technical solution of the present invention, the typical, but non-limitative examples of the present invention are stated as follows.

As for the above-prepared circuit board, the properties thereof, such as dielectric constant (Dk), dielectric loss (Df), signal propagation delay, board insertion loss and the like, are tested at different temperatures, and further stated and described in detail in the following examples, wherein the mass part of organic resins are based on the mass part of organic solids.

Example 1

NE-type 1080 glass fabric (having a mass per unit area of 46.8 g/m$^2$) was used as a reinforcing material; polyphenyl ether resin was dissolved in a solvent, and a filler was added therein to obtain a pre-treating varnish. The varnish formulation and the physical property data of circuit board are shown in Table 1. The circuit board was prepared by the following steps.

Step 1: Preparing a pre-treating varnish. Into a suitable vessel were added 40 parts by mass of polyphenyl ether resin having two terminal modifying groups being acryloyl groups and dicumyl peroxide, as well as a suitable amount of a solvent, stirred for a certain time. Then 25 parts by mass of a first component filler titanium dioxide and 30 parts by mass of a second component filler alumina were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 45 wt. %.

Step 3: Preparing a bonding sheet. Polyphenyl ether resin having two terminal modifying groups being acryloyl groups, a suitable amount of dicumyl peroxide, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 200° C. and at a pressure of 35 Kgf/cm$^2$ for 2 h.

Example 2

NE-type 1080 glass fabric (having a mass per unit area of 46.8 g/m$^2$) was used as a reinforcing material; polyphenyl ether resin was dissolved in a solvent, and a filler was added therein to obtain a pre-treating varnish. The varnish formulation and the physical property data of circuit board are shown in Table 1. The circuit board was prepared by the following steps.

Step 1: Preparing a pre-treating varnish. Into a suitable vessel were added 40 parts by mass of polyphenyl ether resin having two terminal modifying groups being acryloyl groups and dicumyl peroxide, as well as a suitable amount of a solvent, stirred for a certain time. Then 25 parts by mass of a first component filler titanium dioxide and 35 parts by mass of a second component filler alumina were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 45 wt. %.

Step 3: Preparing a bonding sheet. Polyphenyl ether resin having two terminal modifying groups being acryloyl groups, a suitable amount of dicumyl peroxide, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 200° C. and at a pressure of 35 Kgf/cm$^2$ for 2 h.

Example 3

NE-type 1080 glass fabric (having a mass per unit area of 46.8 g/m$^2$) was used as a reinforcing material; polyphenyl ether resin was dissolved in a solvent, and a filler was added therein to obtain a pre-treating varnish. The varnish formulation and the physical property data of circuit board are shown in Table 1. The circuit board was prepared by the following steps.

Step 1: Preparing a pre-treating varnish. Into a suitable vessel were added 40 parts by mass of polyphenyl ether resin having two terminal modifying groups being acryloyl groups and dicumyl peroxide, as well as a suitable amount of a solvent, stirred for a certain time. Then 20 parts by mass of a first component filler titanium dioxide and 30 parts by mass of a second component filler alumina were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 45 wt. %.

Step 3: Preparing a bonding sheet. 1,2-polybutadiene resin, a suitable amount of 2,3-dimethyl-2,3-diphenylbutane, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 240° C. and at a pressure of 55 Kgf/cm² for 3 h.

Example 4

NE-type 3313 glass fabric (having a mass per unit area of 81.4 g/m²) was used as a reinforcing material; polyphenyl ether resin was dissolved in a solvent, and a filler was added therein to obtain a pre-treating varnish. The varnish formulation and the physical property data of circuit board are shown in Table 1. The circuit board was prepared by the following steps.

Step 1: Preparing a pre-treating varnish. Into a suitable vessel were added 40 parts by mass of polyphenyl ether resin having two terminal modifying groups being acryloyl groups and dicumyl peroxide, as well as a suitable amount of a solvent, stirred for a certain time. Then 20 parts by mass of a first component filler titanium dioxide and 35 parts by mass of a second component filler magnesium oxide were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 30 wt. %.

Step 3: Preparing a bonding sheet. Bisphenol-A cyanate ester resin and dicyclopentadiene novolac epoxy resin, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 200° C. and at a pressure of 35 Kgf/cm² for 2 h.

Example 5

NE-type 1078 glass fabric (having a mass per unit area of 47.8 g/m²) was used as a reinforcing material; polybutadiene resin was dissolved in a solvent, and a filler was added therein to obtain a pre-treating varnish. The varnish formulation and the physical property data of circuit board are shown in Table 1. The circuit board was prepared by the following steps.

Step 1: Preparing a pre-treating varnish. Into a suitable vessel were added 40 parts by mass of 1,2-polybutadiene resin and 2,3-dimethyl-2,3-diphenylbutane, as well as a suitable amount of a solvent, stirred for a certain time. Then 25 parts by mass of a first component filler titanium dioxide and 30 parts by mass of a second component filler alumina were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 45 wt. %.

Step 3: Preparing a bonding sheet. Polyphenyl ether resin having two terminal modifying groups being acryloyl groups, a suitable amount of dicumyl peroxide, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 240° C. and at a pressure of 55 Kgf/cm² for 3 h.

Example 6

NE-type 1080 glass fabric (having a mass per unit area of 46.8 g/m²) was used as a reinforcing material; polybutadiene resin was dissolved in a solvent, and a filler was added therein to obtain a pre-treating varnish. The varnish formulation and the physical property data of circuit board are shown in Table 1. The circuit board was prepared by the following steps.

Step 1: Preparing a pre-treating varnish. Into a suitable vessel were added 40 parts by mass of 1,2-polybutadiene resin and 2,3-dimethyl-2,3-diphenylbutane, as well as a suitable amount of a solvent, stirred for a certain time. Then 25 parts by mass of a first component filler titanium dioxide and 35 parts by mass of a second component filler magnesium oxide were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 45 wt. %.

Step 3: Preparing a bonding sheet. Polyphenyl ether resin having two terminal modifying groups being acryloyl groups, a suitable amount of dicumyl peroxide, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 240° C. and at a pressure of 55 Kgf/cm$^2$ for 3 h.

Example 7

NE-type 1080 glass fabric (having a mass per unit area of 46.8 g/m$^2$) was used as a reinforcing material; polybutadiene resin was dissolved in a solvent, and a filler was added therein to obtain a pre-treating varnish. The varnish formulation and the physical property data of circuit board are shown in Table 2. The circuit board was prepared by the following steps.

Step 1: Preparing a pre-treating varnish. Into a suitable vessel were added 40 parts by mass of 1,2-polybutadiene resin and 2,3-dimethyl-2,3-diphenylbutane, as well as a suitable amount of a solvent, stirred for a certain time. Then 20 parts by mass of a first component filler titanium dioxide and 30 parts by mass of a second component filler alumina were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 45 wt. %.

Step 3: Preparing a bonding sheet. 1,2-polybutadiene resin, a suitable amount of 2,3-dimethyl-2,3-diphenylbutane, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 240° C. and at a pressure of 55 Kgf/cm$^2$ for 3 h.

Example 8

NE-type 3313 glass fabric (having a mass per unit area of 81.4 g/m$^2$) was used as a reinforcing material; polybutadiene resin was dissolved in a solvent, and a filler was added therein to obtain a pre-treating varnish. The varnish formulation and the physical property data of circuit board are shown in Table 2. The circuit board was prepared by the following steps.

Step 1: Preparing a pre-treating varnish. Into a suitable vessel were added 40 parts by mass of 1,2-polybutadiene resin and 2,3-dimethyl-2,3-diphenylbutane, as well as a suitable amount of a solvent, stirred for a certain time. Then 20 parts by mass of a first component filler calcium titanate and 35 parts by weight of a second component filler magnesium oxide were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 30 wt. %.

Step 3: Preparing a bonding sheet. 1,2-polybutadiene resin, a suitable amount of 2,3-dimethyl-2,3-diphenylbutane, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 240° C. and at a pressure of 55 Kgf/cm$^2$ for 3 h.

Example 9

NE-type 2116 glass fabric (having a mass per unit area of 103.8 g/m$^2$) was used as a reinforcing material; polyphenyl ether resin was dissolved in a solvent, and a filler was added therein to obtain a pre-treating varnish. The varnish formulation and the physical property data of circuit board are shown in Table 2. The circuit board was prepared by the following steps.

Step 1: Preparing a pre-treating varnish. Into a suitable vessel were added 40 parts by mass of polyphenyl ether resin having two terminal modifying groups being acryloyl groups and dicumyl peroxide, as well as a suitable amount of a solvent, stirred for a certain time. Then 30 parts by mass of a first component filler titanium dioxide and 15 parts by mass of the second component filler magnesium titanate were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 20 wt. %.

Step 3: Preparing a bonding sheet. Bisphenol-A cyanate ester resin and dicyclopentadiene novolac epoxy resin, a suitable amount of dicumyl peroxide, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 200° C. and at a pressure of 35 Kgf/cm$^2$ for 2 h.

Example 10

NE-type 106 glass fabric (having a mass per unit area of 24.4 g/m$^2$) was used as a reinforcing material; polybutadiene resin was dissolved in a solvent, and a filler was added therein to obtain a pre-treating varnish. The varnish formulation and the physical property data of circuit board are shown in Table 2. The circuit board was prepared by the following steps.

Step 1: Preparing a pre-treating varnish. Into a suitable vessel were added 40 parts by mass of 1,2-polybutadiene resin and 2,3-dimethyl-2,3-diphenylbutane, as well as a suitable amount of a solvent, stirred for a certain time. Then 15 parts by mass of a first component filler strontium titanate and 30 parts by mass of a second component filler alumina were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 50 wt. %.

Step 3: Preparing a bonding sheet. 1,2-polybutadiene resin, a suitable amount of 2,3-dimethyl-2,3-diphenylbutane, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 240° C. and at a pressure of 55 Kgf/cm$^2$ for 3 h.

Example 11

NE-type 1078 glass fabric (having a mass per unit area of 47.8 g/m$^2$) was used as a reinforcing material; polybutadiene resin was dissolved in a solvent, and a filler was added therein to obtain a pre-treating varnish. The varnish formulation and the physical property data of circuit board are shown in Table 2. The circuit board was prepared by the following steps.

Step 1: Preparing a pre-treating varnish. Into a suitable vessel were added 40 parts by mass of 1,2-polybutadiene resin and 2,3-dimethyl-2,3-diphenylbutane, as well as a suitable amount of a solvent, stirred for a certain time. Then 25 parts by mass of a first component filler titanium dioxide and 30 parts by mass of a second component filler alumina were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 45 wt. %.

Step 3: One or more of the aforesaid pre-treated NE-type glass fabrics were superimposed together, and a copper foil was superimposed to each of both sides of the superimposed pre-treated NE-type glass fabrics. The superimposed laminate was hot-pressed in a pressing machine to prepare a circuit board, wherein the curing was carried out at a temperature of 240° C. and at a pressure of 55 Kgf/cm$^2$ for 3 h.

Example 12

NE-type 1078 glass fabric (having a mass per unit area of 47.8 g/m$^2$) was used as a reinforcing material; polybutadiene resin was dissolved in a solvent, and a filler was added therein to obtain a pre-treating varnish. The varnish formulation and the physical property data of circuit board are shown in Table 2. The circuit board was prepared by the following steps.

Step 1: Preparing a pre-treating varnish. Into a suitable vessel were added 40 parts by mass of 1,2-polybutadiene resin and 2,3-dimethyl-2,3-diphenylbutane, as well as a suitable amount of a solvent, stirred for a certain time. Then 25 parts by mass of a first component filler titanium dioxide and 30 parts by mass of a second component filler alumina were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 45 wt. %.

Step 3: One or more of the aforesaid pre-treated NE-type glass fabrics were superimposed together, and a copper foil covered with resins was superimposed to each of both sides of the superimposed pre-treated NE-type glass fabrics. The superimposed laminate was hot-pressed in a pressing machine to prepare a circuit board, wherein the curing was carried out at a temperature of 240° C. and at a pressure of 55 Kgf/cm$^2$ for 3 h.

Comparison Example 1

E-type 1080 glass fabric (having a mass per unit area of 46.8 g/m$^2$) was used as a reinforcing material; polyphenyl ether resin was dissolved in a solvent, and a filler was added therein to obtain a pre-treating varnish. The varnish formulation and the physical property data of circuit board are shown in Table 3. The circuit board was prepared by the following steps.

Step 1: Preparing a pre-treating varnish. Into a suitable vessel were added 40 parts by mass of polyphenyl ether resin having two terminal modifying groups being acryloyl groups and dicumyl peroxide, as well as a suitable amount of a solvent, stirred for a certain time. Then 25 parts by mass of a first component filler titanium dioxide and 30 parts by weight of a second component filler alumina were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 45 wt. %.

Step 3: Preparing a bonding sheet. Polyphenyl ether resin having two terminal modifying groups being acryloyl groups, a suitable amount of dicumyl peroxide, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 200° C. and at a pressure of 35 Kgf/cm$^2$ for 2 h.

Comparison Example 2

NE-type 1080 glass fabric (having a mass per unit area of 46.8 g/m$^2$) was used as a reinforcing material; epoxy resin was dissolved in a solvent, and a filler was added therein to obtain a pre-treating varnish. The varnish formulation and the physical property data of circuit board are shown in Table 3. The circuit board was prepared by the following steps.

Step 1: Preparing a pre-treating varnish. Into a suitable vessel were added 40 parts by mass of bisphenol-A epoxy resin and bisphenol-A novolac resin, as well as a suitable amount of a solvent, stirred for a certain time. Then 25 parts by mass of a first component filler titanium dioxide and 35 parts by mass of a second component filler magnesium oxide were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 45 wt. %.

Step 3: Preparing a bonding sheet. Polyphenyl ether resin having two terminal modifying groups being acryloyl groups, a suitable amount of dicumyl peroxide, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 200° C. and at a pressure of 35 Kgf/cm$^2$ for 2 h.

Comparison Example 3

NE-type 1080 glass fabric (having a mass per unit area of 46.8 g/m$^2$) was used as a reinforcing material; polyphenyl ether resin was dissolved in a solvent, and a filler was added therein to obtain a pre-treating varnish. The varnish formulation and the physical property data of circuit board are shown in Table 3. The circuit board was prepared by the following steps.

Step 1: Preparing a pre-treating varnish. Into a suitable vessel were added 40 parts by mass of polyphenyl ether resin having two terminal modifying groups being acryloyl groups and dicumyl peroxide, as well as a suitable amount of a solvent, stirred for a certain time. Then 10 parts by mass of a first component filler calcium titanate and 20 parts by mass of a second component filler alumina were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 45 wt. %.

Step 3: Preparing a bonding sheet. 1,2-polybutadiene resin, a suitable amount of 2,3-dimethyl-2,3-diphenylbutane, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 240° C. and at a pressure of 55 Kgf/cm$^2$ for 3 h.

Comparison Example 4

NE-type 3313 glass fabric (having a mass per unit area of 81.4 g/m$^2$) was used as a reinforcing material; polyphenyl ether resin was dissolved in a solvent, and a filler was added therein to obtain a pre-treating varnish. The varnish formulation and the physical property data of circuit board are shown in Table 3. The circuit board was prepared by the following steps.

Step 1: Preparing a pre-treating varnish. Into a suitable vessel were added 40 parts by mass of polyphenyl ether resin having two terminal modifying groups being acryloyl groups and dicumyl peroxide, as well as a suitable amount of a solvent, stirred for a certain time. Then 50 parts by mass of a first component filler calcium titanate and 25 parts by mass of a second component filler magnesium oxide were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 30 wt. %.

Step 3: Preparing a bonding sheet. Bisphenol-A cyanate ester resin and dicyclopentadiene novolac epoxy resin, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 200° C. and at a pressure of 35 Kgf/cm$^2$ for 2 h.

Comparison Example 5

NE-type 1080 glass fabric (having a mass per unit area of 46.8 g/m$^2$) was used as a reinforcing material; polybutadiene resin was dissolved in a solvent, and a filler was added therein to obtain a pre-treating varnish. The varnish formulation and the physical property data of circuit board are shown in Table 3. The circuit board was prepared by the following steps.

Step 1: Preparing a pre-treating varnish. Into a suitable vessel were added 40 parts by mass of 1,2-polybutadiene resin and 2,3-dimethyl-2,3-diphenylbutane, as well as a suitable amount of a solvent, stirred for a certain time. Then 40 parts by mass of a first component filler titanium dioxide and 5 parts by weight of a second component filler silicon dioxide were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 45 wt. %.

Step 3: Preparing a bonding sheet. Polyphenyl ether resin having two terminal modifying groups being acryloyl groups, a suitable amount of dicumyl peroxide, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 240° C. and at a pressure of 55 Kgf/cm$^2$ for 3 h.

Comparison Example 6

NE-type 1080 glass fabric (having a mass per unit area of 46.8 g/m$^2$) was used as a reinforcing material; polybutadiene resin was dissolved in a solvent, and a filler was added therein to obtain a pre-treating varnish. The varnish formulation and the physical property data of circuit board are shown in Table 4. The circuit board was prepared by the following steps.

Step 1: Preparing a pre-treating varnish. Into a suitable vessel were added 40 parts by mass of 1,2-polybutadiene resin and 2,3-dimethyl-2,3-diphenylbutane, as well as a suitable amount of a solvent, stirred for a certain time. Then 25 parts by mass of a first component filler titanium dioxide and 35 parts by weight of a second component filler magnesium oxide were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 45 wt. %.

Step 3: Preparing a bonding sheet. Bisphenol-A epoxy resin and a suitable amount of bisphenol-A novolac resin, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 240° C. and at a pressure of 55 Kgf/cm$^2$ for 3 h.

Comparison Example 7

NE-type 1080 glass fabric (having a mass per unit area of 46.8 g/m$^2$) was used as a reinforcing material; polybutadiene resin was dissolved in a solvent, and a filler was added therein to obtain a pre-treating varnish. The varnish formulation and the physical property data of circuit board are shown in Table 4. The circuit board was prepared by the following steps.

Step 1: Preparing a pre-treating varnish. Into a suitable vessel were added 40 parts by mass of 1,2-polybutadiene resin and 2,3-dimethyl-2,3-diphenylbutane, as well as a suitable amount of a solvent, stirred for a certain time. Then 50 parts by mass of a first component filler calcium titanate and 10 parts by mass of a second component filler alumina were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 45 wt. %.

Step 3: Preparing a bonding sheet. 1,2-polybutadiene resin, a suitable amount of 2,3-dimethyl-2,3-diphenylbutane, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 240° C. and at a pressure of 55 Kgf/cm$^2$ for 3 h.

Comparison Example 8

NE-type 3313 glass fabric (having a mass per unit area of 81.4 g/m$^2$) was used as a reinforcing material; polybutadiene resin was dissolved in a solvent, and a filler was added therein to obtain a pre-treating varnish. The varnish formulation and the physical property data of circuit board are shown in Table 4. The circuit board was prepared by the following steps.

Step 1: Preparing a pre-treating varnish. Into a suitable vessel were added 40 parts by mass of 1,2-polybutadiene resin and 2,3-dimethyl-2,3-diphenylbutane, as well as a suitable amount of a solvent, stirred for a certain time. Then 10 parts by mass of a first component filler calcium titanate and 50 parts by mass of a second component filler magnesium oxide were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 30 wt. %.

Step 3: Preparing a bonding sheet. 1,2-polybutadiene resin, a suitable amount of 2,3-dimethyl-2,3-diphenylbutane, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 240° C. and at a pressure of 55 Kgf/cm$^2$ for 3 h.

Comparison Example 9

NE-type 2116 glass fabric (having a mass per unit area of 103.8 g/m$^2$) was used as a reinforcing material; polyphenyl ether resin was dissolved in a solvent, and a filler was added therein to obtain a pre-treating varnish. The varnish formulation and the physical property data of circuit board are shown in Table 4. The circuit board was prepared by the following steps.

Step 1: Preparing a pre-treating varnish. Into a suitable vessel were added 40 parts by mass of polyphenyl ether resin having two terminal modifying groups being acryloyl groups and dicumyl peroxide, as well as a suitable amount of a solvent, stirred for a certain time. Then 30 parts by mass of a first component filler titanium dioxide and 15 parts by mass of a second component filler magnesium titanate were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 15 wt. %.

Step 3: Preparing a bonding sheet. Bisphenol-A cyanate ester resin and dicyclopentadiene novolac epoxy resin, as well as a suitable amount of a solvent were used to prepare a main resin varnish. Then the main resin varnish was used to mainly impregnate the aforesaid pre-treated NE-type glass fabric. After that, the solvent was dried to obtain a bonding sheet.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 200° C. and at a pressure of 35 Kgf/cm$^2$ for 2 h.

Comparison Example 10

NE-type 106 glass fabric (having a mass per unit area of 24.4 g/m$^2$) was used as a reinforcing material; polybutadiene resin was dissolved in a solvent, and a filler was added therein to obtain a pre-treating varnish. The varnish formulation and the physical property data of circuit board are shown in Table 4. The circuit board was prepared by the following steps.

Step 1: Preparing a pre-treating varnish. Into a suitable vessel were added 40 parts by mass of 1,2-polybutadiene resin and 2,3-dimethyl-2,3-diphenylbutane, as well as a suitable amount of solvent, stirred for a certain time. Then 15 parts by mass of a first component filler strontium titanate and 30 parts by mass of a second component filler alumina were added, sufficiently stirred, and emulsified and dispersed to form a pre-treating varnish.

Step 2: Preparing a pre-treated NE-type glass fabric. NE-type glass fabric was pre-impregnated with the aforesaid pre-treating varnish; and the solvent was dried to obtain a pre-treated NE-type glass fabric having a resin content of 60 wt. %.

Step 3: Preparing a bonding sheet. 1,2-polybutadiene resin, a suitable amount of 2,3-dimethyl-2,3-diphenylbutane, as well as a suitable amount of a solvent were used to prepare a main resin varnish. Then the main resin varnish was used to mainly impregnate the aforesaid pre-treated NE-type glass fabric. After that, the solvent was dried to obtain a bonding sheets.

Step 4: One or more of the aforesaid bonding sheets were superimposed together, and a copper foil was superimposed to each of both sides of the superimposed bonding sheets. The superimposed laminate was hot-pressed in a pressing machine to prepare a circuit board, wherein the curing was carried out at a temperature of 240° C. and at a pressure of 55 Kgf/cm$^2$ for 3 h.

TABLE 1

Formulations in each example and the physical property data thereof

| | | Examples | | | | | |
|---|---|---|---|---|---|---|---|
| | | 1 | 2 | 3 | 4 | 5 | 6 |
| Type of glass fabrics | | NE-type | NE-type | NE-type | NE-type | NE-type | NE-type |
| Model of glass fabrics | | 1080 | 1080 | 1080 | 3313 | 1078 | 1080 |
| Pre-treating varnish resin system | | Polyphenyl ether | Polyphenyl ether | Polyphenyl ether | Polyphenyl ether | polybutadiene | polybutadiene |
| First component filler | | Titanium dioxide | Titanium dioxide | Calcium titanate | Calcium titanate | Titanium dioxide | Titanium dioxide |
| Second component filler | | Alumina | Magnesium oxide | Alumina | Magnesium oxide | Alumina | Magnesium oxide |
| Amount of the pre-treating varnish resin | | 40 | 40 | 40 | 40 | 40 | 40 |
| Amount of first component filler | | 25 | 25 | 20 | 20 | 25 | 25 |
| Amount of second component filler | | 30 | 35 | 30 | 35 | 30 | 35 |
| Dk of the pre-treating varnish | 85° C. | 4.571 | 4.583 | 4.561 | 4.581 | 4.518 | 4.526 |
| | 50° C. | 4.545 | 4.564 | 4.542 | 4.565 | 4.497 | 4.517 |
| | 25° C. | 4.518 | 4.536 | 4.523 | 4.546 | 4.486 | 4.494 |
| | 0° C. | 4.491 | 4.517 | 4.504 | 4.514 | 4.465 | 4.475 |
| | −25° C. | 4.482 | 4.495 | 4.476 | 4.493 | 4.451 | 4.451 |
| | −55° C. | 4.456 | 4.472 | 4.468 | 4.472 | 4.432 | 4.449 |
| Df of the pre-treating varnish | 85° C. | 0.00411 | 0.00404 | 0.00422 | 0.00431 | 0.00389 | 0.00417 |
| | 50° C. | 0.00395 | 0.00382 | 0.00404 | 0.00423 | 0.00367 | 0.00398 |
| | 25° C. | 0.00388 | 0.00375 | 0.00396 | 0.00414 | 0.00358 | 0.00375 |
| | 0° C. | 0.00369 | 0.00364 | 0.00377 | 0.00396 | 0.00336 | 0.00362 |
| | −25° C. | 0.00347 | 0.00336 | 0.00351 | 0.00378 | 0.00314 | 0.00343 |
| | −55° C. | 0.00335 | 0.00322 | 0.00332 | 0.00369 | 0.00305 | 0.00334 |
| Resin content of the pre-treated glass fabrics | | 45 wt. % | 45 wt. % | 45 wt. % | 30 wt. % | 45 wt. % | 45 wt. % |
| Main impregnating resin system | | Polyphenyl ether | Polyphenyl ether | Polybutadiene | Cyanate | Polyphenyl ether | Polyphenyl ether |

TABLE 1-continued

Formulations in each example and the physical property data thereof

| | | Examples | | | | | |
|---|---|---|---|---|---|---|---|
| | | 1 | 2 | 3 | 4 | 5 | 6 |
| Dk (25° C.) of the main impregnating varnish | | 2.565 | 2.565 | 2.354 | 3.089 | 2.565 | 2.564 |
| Df (25° C.) of the main impregnating varnish | | 0.00224 | 0.00224 | 0.00186 | 0.00682 | 0.00224 | 0.00224 |
| Dk of the circuit board | 85° C. | 3.706 | 3.708 | 3.701 | 3.712 | 3.698 | 3.704 |
| | 50° C. | 3.701 | 3.703 | 3.692 | 3.708 | 3.687 | 3.697 |
| | 25° C. | 3.688 | 3.683 | 3.682 | 3.693 | 3.678 | 3.686 |
| | 0° C. | 3.673 | 3.675 | 3.676 | 3.682 | 3.669 | 3.675 |
| | −25° C. | 3.663 | 3.663 | 3.659 | 3.675 | 3.658 | 3.662 |
| | −55° C. | 3.653 | 3.652 | 3.648 | 3.664 | 3.649 | 3.654 |
| Df of the circuit board | 85° C. | 0.00403 | 0.00405 | 0.00401 | 0.00425 | 0.00402 | 0.00401 |
| | 50° C. | 0.00387 | 0.00391 | 0.00388 | 0.00413 | 0.00385 | 0.00385 |
| | 25° C. | 0.00382 | 0.00388 | 0.00378 | 0.00398 | 0.00381 | 0.00381 |
| | 0° C. | 0.00371 | 0.00375 | 0.00368 | 0.00389 | 0.00372 | 0.00375 |
| | −25° C. | 0.00357 | 0.00361 | 0.00359 | 0.00367 | 0.00355 | 0.00364 |
| | −55° C. | 0.00335 | 0.00342 | 0.00338 | 0.00353 | 0.00334 | 0.00341 |
| Warp-wise signal propagation delay/ps | 85° C. | 9 | 10 | 12 | 14 | 11 | 11 |
| | 50° C. | 6 | 7 | 8 | 10 | 9 | 8 |
| | 25° C. | 4 | 6 | 5 | 7 | 5 | 4 |
| | 0° C. | 5 | 7 | 9 | 9 | 8 | 6 |
| | −25° C. | 7 | 9 | 11 | 12 | 12 | 9 |
| | −55° C. | 11 | 12 | 15 | 14 | 16 | 12 |
| Weft-wise signal propagation delay/ps | 85° C. | 7 | 9 | 10 | 13 | 12 | 9 |
| | 50° C. | 5 | 5 | 6 | 9 | 9 | 7 |
| | 25° C. | 1 | 3 | 2 | 4 | 2 | 2 |
| | 0° C. | 3 | 5 | 4 | 8 | 9 | 8 |
| | −25° C. | 6 | 8 | 9 | 10 | 11 | 13 |
| | −55° C. | 8 | 9 | 10 | 13 | 12 | 15 |
| Insertion loss of the board at 10 GHz/ (dB/inch) | 85° C. | −0.687 | −0.691 | −0.689 | −0.698 | −0.685 | −0.681 |
| | 50° C. | −0.669 | −0.668 | −0.653 | −0.657 | −0.652 | −0.653 |
| | 25° C. | −0.636 | −0.648 | −0.641 | −0.648 | −0.635 | −0.637 |
| | 0° C. | −0.598 | −0.607 | −0.603 | −0.616 | −0.593 | −0.595 |
| | −25° C. | −0.565 | −0.576 | −0.571 | −0.574 | −0.562 | −0.566 |
| | −55° C. | −0.547 | −0.553 | −0.549 | −0.552 | −0.543 | −0.545 |

TABLE 2

Formulations in each example and the physical property data thereof

| | | Examples | | | | | |
|---|---|---|---|---|---|---|---|
| | | 7 | 8 | 9 | 10 | 11 | 12 |
| Type of glass fabrics | | NE-type | NE-type | NE-type | NE-type | NE-type | NE-type |
| Model of glass fabrics | | 1080 | 3313 | 2116 | 106 | 1078 | 1078 |
| Pre-treating varnish resin system | | polybutadiene | polybutadiene | Polyphenyl ether | polybutadiene | polybutadiene | polybutadiene |
| First component filler | | Calcium titanate | Calcium titanate | Titanium dioxide | Strontium titanate | Titanium dioxide | Titanium dioxide |
| Second component filler | | Alumina | Magnesium oxide | Magnesium titanate | Alumina | Alumina | Alumina |
| Amount of the pre-treating varnish resin | | 40 | 40 | 40 | 40 | 40 | 40 |
| Amount of first component filler | | 20 | 20 | 30 | 15 | 25 | 25 |
| Amount of second component filler | | 30 | 35 | 15 | 30 | 30 | 30 |
| Dk of the pre-treating varnish | 85° C. | 4.562 | 4.574 | 4.583 | 4.581 | 4.518 | 4.518 |
| | 50° C. | 4.543 | 4.553 | 4.574 | 4.563 | 4.497 | 4.497 |
| | 25° C. | 4.521 | 4.531 | 4.567 | 4.551 | 4.486 | 4.486 |
| | 0° C. | 4.515 | 4.512 | 4.548 | 4.535 | 4.465 | 4.465 |
| | −25° C. | 4.498 | 4.486 | 4.526 | 4.513 | 4.451 | 4.451 |
| | −55° C. | 4.477 | 4.458 | 4.515 | 4.498 | 4.432 | 4.432 |
| Df of the pre-treating varnish | 85° C. | 0.00412 | 0.00427 | 0.00611 | 0.00657 | 0.00389 | 0.00389 |
| | 50° C. | 0.00394 | 0.00409 | 0.00592 | 0.00646 | 0.00367 | 0.00367 |
| | 25° C. | 0.00386 | 0.00394 | 0.00585 | 0.00629 | 0.00358 | 0.00358 |
| | 0° C. | 0.00368 | 0.00375 | 0.00568 | 0.00598 | 0.00336 | 0.00336 |
| | −25° C. | 0.00347 | 0.00352 | 0.00558 | 0.00575 | 0.00314 | 0.00314 |
| | −55° C. | 0.00325 | 0.00348 | 0.00533 | 0.00557 | 0.00305 | 0.00305 |
| Resin content of the pre-treated glass fabrics | | 45 wt. % | 30 wt. % | 20 wt. % | 50 wt. % | 45 wt. % | 45 wt. % |

TABLE 2-continued

Formulations in each example and the physical property data thereof

|  |  | Examples | | | | | |
|---|---|---|---|---|---|---|---|
|  |  | 7 | 8 | 9 | 10 | 11 | 12 |
| Main impregnating resin system | | Polybutadiene | Polybutadiene | Cyanate | Polybutadiene | — | — |
| Dk (25° C.) of the main impregnating varnish | | 2.354 | 2.354 | 3.089 | 2.354 | — | — |
| Df (25° C.) of the main impregnating varnish | | 0.00186 | 0.00186 | 0.00682 | 0.00186 | — | — |
| Dk of the circuit board | 85° C. | 3.702 | 3.696 | 3.876 | 3.795 | 4.512 | 4.510 |
| | 50° C. | 3.698 | 3.687 | 3.867 | 3.783 | 4.509 | 4.506 |
| | 25° C. | 3.689 | 3.676 | 3.853 | 3.772 | 4.505 | 4.502 |
| | 0° C. | 3.679 | 3.662 | 3.841 | 3.761 | 4.501 | 4.497 |
| | −25° C. | 3.665 | 3.654 | 3.832 | 3.758 | 4.496 | 4.495 |
| | −55° C. | 3.656 | 3.642 | 3.819 | 3.745 | 4.492 | 4.491 |
| Df of the circuit board | 85° C. | 0.00403 | 0.00401 | 0.00502 | 0.00521 | 0.00368 | 0.00366 |
| | 50° C. | 0.00391 | 0.00386 | 0.00491 | 0.00509 | 0.00362 | 0.00365 |
| | 25° C. | 0.00383 | 0.00384 | 0.00481 | 0.00498 | 0.00365 | 0.00363 |
| | 0° C. | 0.00374 | 0.00372 | 0.00469 | 0.00479 | 0.00361 | 0.00360 |
| | −25° C. | 0.00369 | 0.00361 | 0.00456 | 0.00487 | 0.00358 | 0.00358 |
| | −55° C. | 0.00345 | 0.00338 | 0.00445 | 0.00475 | 0.00355 | 0.00356 |
| Warp-wise signal propagation delay/ps | 85° C. | 10 | 12 | 16 | 14 | 11 | 10 |
| | 50° C. | 7 | 8 | 12 | 11 | 7 | 8 |
| | 25° C. | 5 | 6 | 9 | 8 | 5 | 7 |
| | 0° C. | 8 | 9 | 11 | 10 | 8 | 9 |
| | −25° C. | 10 | 11 | 13 | 13 | 11 | 12 |
| | −55° C. | 13 | 15 | 17 | 18 | 13 | 15 |
| Weft-wise signal propagation delay/ps | 85° C. | 11 | 12 | 15 | 13 | 11 | 12 |
| | 50° C. | 7 | 8 | 11 | 9 | 7 | 8 |
| | 25° C. | 3 | 3 | 6 | 5 | 4 | 3 |
| | 0° C. | 6 | 6 | 8 | 7 | 6 | 7 |
| | −25° C. | 9 | 10 | 11 | 10 | 9 | 10 |
| | −55° C. | 14 | 12 | 13 | 12 | 10 | 11 |
| Insertion loss of the board at 10 GHz/ (dB/inch) | 85° C. | −0.698 | −0.683 | −0.887 | −0.898 | −0.678 | −0.671 |
| | 50° C. | −0.665 | −0.651 | −0.854 | −0.856 | −0.661 | −0.658 |
| | 25° C. | −0.642 | −0.642 | −0.842 | −0.849 | −0.638 | −0.644 |
| | 0° C. | −0.602 | −0.593 | −0.803 | −0.816 | −0.611 | −0.615 |
| | −25° C. | −0.573 | −0.569 | −0.776 | −0.774 | −0.567 | −0.564 |
| | −55° C. | −0.556 | −0.546 | −0.748 | −0.757 | −0.554 | −0.549 |

TABLE 3

Formulations in each Comparison example and the physical property data thereof

|  |  | Examples | | | | |
|---|---|---|---|---|---|---|
|  |  | 1 | 2 | 3 | 4 | 5 |
| Type of glass fabrics | | E-type | NE-type | NE-type | NE-type | NE-type |
| Model of glass fabrics | | 1080 | 1080 | 1080 | 3313 | 1078 |
| Pre-treating varnish resin system | | Polyphenyl ether | Epoxy | Polyphenyl ether | Polyphenyl ether | Polybutadiene |
| First component filler | | Titanium dioxide | Titanium dioxide | Calcium titanate | Calcium titanate | Titanium dioxide |
| Second component filler | | Alumina | Magnesium oxide | Alumina | Magnesium oxide | Titanium dioxide |
| Amount of the pre-treating varnish resin | | 40 | 40 | 40 | 40 | 40 |
| Amount of first component filler | | 25 | 25 | 10 | 50 | 40 |
| Amount of second component filler | | 30 | 35 | 20 | 25 | 5 |
| Dk of the pre-treating varnish | 85° C. | 4.571 | 4.682 | 3.721 | 5.723 | 4.972 |
| | 50° C. | 4.545 | 4.653 | 3.692 | 5.692 | 4.865 |
| | 25° C. | 4.518 | 4.624 | 3.664 | 5.654 | 4.552 |
| | 0° C. | 4.491 | 4.605 | 3.615 | 5.615 | 4.446 |
| | −25° C. | 4.482 | 4.577 | 3.552 | 5.586 | 4.238 |
| | −55° C. | 4.456 | 4.558 | 3.518 | 5.557 | 4.131 |
| Df of the pre-treating varnish | 85° C. | 0.00411 | 0.00916 | 0.00512 | 0.00531 | 0.0045 |
| | 50° C. | 0.00395 | 0.00895 | 0.00481 | 0.00514 | 0.0042 |
| | 25° C. | 0.00388 | 0.00857 | 0.00453 | 0.00485 | 0.0038 |
| | 0° C. | 0.00369 | 0.00834 | 0.00415 | 0.00469 | 0.0035 |
| | −25° C. | 0.00347 | 0.00793 | 0.00396 | 0.00438 | 0.0033 |
| | −55° C. | 0.00335 | 0.00752 | 0.00387 | 0.00427 | 0.0031 |

TABLE 3-continued

Formulations in each Comparison example and the physical property data thereof

| | | Examples | | | | |
|---|---|---|---|---|---|---|
| | | 1 | 2 | 3 | 4 | 5 |
| Resin content of the pre-treated glass fabrics | | 45 wt. % | 45 wt. % | 45 wt. % | 30 wt. % | 45 wt. % |
| Main impregnating resin system | | Polyphenyl ether | Polyphenyl ether | Polybutadiene | Cyanate | Polyphenyl ether |
| Dk (25° C.) of the main impregnating varnish | | 2.565 | 2.565 | 2.354 | 3.089 | 2.565 |
| Df (25° C.) of the main impregnating varnish | | 0.00224 | 0.00224 | 0.00186 | 0.00682 | 0.00224 |
| Dk of the circuit board | 85° C. | 3.902 | 3.905 | 3.553 | 4.012 | 3.542 |
| | 50° C. | 3.898 | 3.897 | 3.545 | 4.009 | 3.561 |
| | 25° C. | 3.888 | 3.885 | 3.531 | 3.995 | 3.592 |
| | 0° C. | 3.872 | 3.869 | 3.522 | 3.984 | 3.608 |
| | −25° C. | 3.861 | 3.858 | 3.509 | 3.975 | 3.652 |
| | −55° C. | 3.856 | 3.848 | 3.498 | 3.965 | 3.713 |
| Df of the circuit board | 85° C. | 0.00704 | 0.00712 | 0.00382 | 0.00625 | 0.00454 |
| | 50° C. | 0.00686 | 0.00698 | 0.00368 | 0.00615 | 0.00438 |
| | 25° C. | 0.00682 | 0.00687 | 0.00356 | 0.00598 | 0.00431 |
| | 0° C. | 0.00673 | 0.00675 | 0.00348 | 0.00588 | 0.00422 |
| | −25° C. | 0.00656 | 0.00657 | 0.00337 | 0.00569 | 0.00409 |
| | −55° C. | 0.00632 | 0.00635 | 0.00319 | 0.00557 | 0.00386 |
| Warp-wise signal propagation delay/ps | 85° C. | 356 | 52 | 561 | 576 | 452 |
| | 50° C. | 247 | 45 | 455 | 489 | 214 |
| | 25° C. | 135 | 23 | 364 | 421 | 16 |
| | 0° C. | 96 | 16 | 289 | 352 | 156 |
| | −25° C. | 158 | 29 | 374 | 438 | 286 |
| | −55° C. | 269 | 37 | 422 | 513 | 418 |
| Weft-wise signal propagation delay/ps | 85° C. | 312 | 42 | 512 | 552 | 414 |
| | 50° C. | 234 | 36 | 423 | 417 | 208 |
| | 25° C. | 121 | 19 | 315 | 386 | 12 |
| | 0° C. | 85 | 15 | 273 | 314 | 126 |
| | −25° C. | 132 | 24 | 358 | 416 | 258 |
| | −55° C. | 238 | 29 | 409 | 509 | 413 |
| Insertion loss of the board at 10 GHz/ (dB/inch) | 85° C. | −1.294 | −1.361 | −0.678 | −0.954 | −0.754 |
| | 50° C. | −1.281 | −1.343 | −0.627 | −0.912 | −0.722 |
| | 25° C. | −1.248 | −1.315 | −0.584 | −0.905 | −0.706 |
| | 0° C. | −1.213 | −1.278 | −0.566 | −0.872 | −0.698 |
| | −25° C. | −1.177 | −1.239 | −0.553 | −0.838 | −0.654 |
| | −55° C. | −1.159 | −1.221 | −0.525 | −0.813 | −0.627 |

TABLE 4

Formulations in each Comparison example and the physical property data thereof

| | | Examples | | | | |
|---|---|---|---|---|---|---|
| | | 6 | 7 | 8 | 9 | 10 |
| Type of glass fabrics | | NE-type | NE-type | NE-type | NE-type | NE-type |
| Model of glass fabrics | | 1080 | 1080 | 3313 | 2116 | 106 |
| Pre-treating varnish resin system | | Polybutadiene | Polybutadiene | Polybutadiene | Polyphenyl ether | Polybutadiene |
| First component filler | | Titanium dioxide | Calcium titanate | Calcium titanate | Titanium dioxide | Strontium titanate |
| Second component filler | | Magnesium oxide | Alumina | Magnesium oxide | Magnesium titanate | Alumina |
| Amount of the pre-treating varnish resin | | 40 | 40 | 40 | 40 | 40 |
| Amount of first component filler | | 25 | 50 | 10 | 30 | 15 |
| Amount of second component filler | | 35 | 10 | 50 | 15 | 30 |
| Dk of the pre-treating varnish | 85° C. | 4.526 | 4.973 | 4.969 | 4.583 | 4.581 |
| | 50° C. | 4.517 | 4.862 | 4.861 | 4.574 | 4.563 |
| | 25° C. | 4.494 | 4.554 | 4.552 | 4.567 | 4.551 |
| | 0° C. | 4.475 | 4.441 | 4.439 | 4.548 | 4.535 |
| | −25° C. | 4.451 | 4.235 | 4.234 | 4.526 | 4.513 |
| | −55° C. | 4.449 | 4.130 | 4.129 | 4.515 | 4.498 |
| Df of the pre-treating varnish | 85° C. | 0.00417 | 0.0043 | 0.0041 | 0.00611 | 0.00657 |
| | 50° C. | 0.00398 | 0.0041 | 0.0039 | 0.00592 | 0.00646 |
| | 25° C. | 0.00375 | 0.0039 | 0.0038 | 0.00585 | 0.00629 |
| | 0° C. | 0.00362 | 0.0037 | 0.0037 | 0.00568 | 0.00598 |

TABLE 4-continued

Formulations in each Comparison example and the physical property data thereof

| | | Examples | | | | |
|---|---|---|---|---|---|---|
| | | 6 | 7 | 8 | 9 | 10 |
| | −25° C. | 0.00343 | 0.0036 | 0.0035 | 0.00558 | 0.00575 |
| | −55° C. | 0.00334 | 0.0034 | 0.0034 | 0.00533 | 0.00557 |
| Resin content of the pre-treated glass fabrics | | 45 wt. % | 45 wt. % | 30 wt. % | 15 wt. % | 60 wt. % |
| Main impregnating resin system | | Epoxy | Polybutadiene | Polybutadiene | Cyanate | Polybutadiene |
| Dk (25° C.) of the main impregnating varnish | | 3.865 | 2.354 | 2.354 | 3.089 | 2.354 |
| Df (25° C.) of the main impregnating varnish | | 0.01125 | 0.00186 | 0.00186 | 0.00682 | 0.00186 |
| Dk of the circuit board | 85° C. | 4.216 | 3.643 | 3.724 | 4.033 | 4.212 |
| | 50° C. | 4.218 | 3.662 | 3.718 | 4.026 | 4.208 |
| | 25° C. | 4.198 | 3.685 | 3.688 | 4.019 | 4.196 |
| | 0° C. | 4.185 | 3.698 | 3.671 | 4.008 | 4.181 |
| | −25° C. | 4.174 | 3.712 | 3.652 | 3.999 | 4.175 |
| | −55° C. | 4.162 | 3.726 | 3.641 | 3.991 | 4.157 |
| Df of the circuit board | 85° C. | 0.00824 | 0.00405 | 0.00401 | 0.00772 | 0.00451 |
| | 50° C. | 0.00813 | 0.00397 | 0.00385 | 0.00766 | 0.00437 |
| | 25° C. | 0.00799 | 0.00392 | 0.00378 | 0.00749 | 0.00426 |
| | 0° C. | 0.00787 | 0.00385 | 0.00367 | 0.00738 | 0.00418 |
| | −25° C. | 0.00768 | 0.00369 | 0.00358 | 0.00721 | 0.00407 |
| | −55° C. | 0.00755 | 0.00361 | 0.00342 | 0.00708 | 0.00388 |
| Warp-wise signal propagation delay/ps | 85° C. | 19 | 256 | 287 | 206 | 16 |
| | 50° C. | 13 | 134 | 167 | 139 | 13 |
| | 25° C. | 9 | 11 | 15 | 67 | 10 |
| | 0° C. | 14 | 167 | 186 | 128 | 12 |
| | −25° C. | 16 | 254 | 278 | 249 | 15 |
| | −55° C. | 18 | 376 | 388 | 314 | 18 |
| Weft-wise signal propagation delay/ps | 85° C. | 15 | 246 | 265 | 178 | 15 |
| | 50° C. | 11 | 112 | 127 | 112 | 12 |
| | 25° C. | 7 | 9 | 12 | 56 | 8 |
| | 0° C. | 9 | 151 | 164 | 176 | 11 |
| | −25° C. | 12 | 198 | 203 | 243 | 14 |
| | −55° C. | 14 | 223 | 312 | 305 | 17 |
| Insertion loss of the board at 10 GHz/ (dB/inch) | 85° C. | −1.515 | −0.708 | −0.688 | −1.392 | −0.747 |
| | 50° C. | −1.497 | −0.675 | −0.657 | −1.374 | −0.718 |
| | 25° C. | −1.469 | −0.651 | −0.641 | −1.345 | −0.702 |
| | 0° C. | −1.432 | −0.613 | −0.595 | −1.308 | −0.694 |
| | −25° C. | −1.393 | −0.582 | −0.564 | −1.267 | −0.646 |
| | −55° C. | −1.375 | −0.548 | −0.545 | −1.256 | −0.622 |

The aforesaid properties are tested as follows.

(1) Dielectric properties Dk/Df: the dielectric constant Dk and dielectric loss Df of the boards were tested at 10 GHz and at −55° C., −25° C., 0° C., 25° C., 50° C. and 85° C. by means of SPDR.

(2) Signal propagation delay: the testing was made according to the method as stipulated under IPC TM-650 2.5.5.11; according to the directions of transmission lines on the circuit boards, the tested signal propagation delay was divided into warp-wise signal propagation delay and weft-wise signal propagation delay; the warp-wise signal propagation delay refers to the signal propagation delay tested when the transmission lines were wired in the warp-wise direction of the circuit boards; the weft-wise signal propagation delay refers to the signal propagation delay tested when the transmission lines were wired in the weft-wise direction of the circuit boards; the warp-wise signal propagation delay and weft-wise signal propagation delay of the boards were respectively tested at −55° C., −25° C., 0° C., 25° C., 50° C. and 85° C.

(3) Board insertion loss: the testing was made according to the method as stipulated under IPC TM-650 2.5.5.12A; the same copper foils were used for the circuit boards; the signal loss was represented with board insertion loss; board insertion loss was tested at −55° C., −25° C., 0° C., 25° C., 50° C. and 85° C. to compare the signal loss by using the insertion loss at 10 GHz.

(4) Resin content: tested according to the method as stipulated under IPC TM-650 2.3.16.1.

Analyses of physical property results:

In Comparison Example 1 as compared to Example 1, E-type glass fabric was used. The Dk of the pre-treating varnish was seriously lower than the Dk of the E-type glass fabric. The circuit board had a problem of signal propagation delay. Meanwhile, the circuit board had a higher Df, resulting in a higher board insertion loss.

In Comparison Example 2 as compared to Example 2, the pre-treating varnish resin was epoxy resin, and the Dk thereof was close to the Dk of the NE-type glass fabric. The circuit board had no obvious signal propagation delay problem. Meanwhile, the circuit board had a higher Df, resulting in a higher board insertion loss.

In Comparison Example 3 as compared to Example 3, the Dk of the pre-treating varnish was seriously lower than the Dk of the NE-type glass fabric. The circuit board had a problem of signal propagation delay. Meanwhile, the circuit board had a lower Df, so did the board insertion loss.

In Comparison Example 4 as compared to Example 4, the Dk of the pre-treating varnish was seriously higher than the Dk of the NE-type glass fabric. The circuit board had a problem of signal propagation delay. Meanwhile, the circuit board had a higher Df, resulting in a higher board insertion loss.

In Comparison Example 5 as compared to Example 5, the circuit boards had no signal propagation delay problem at 25° C. With the decrease or increase of temperature, the signal propagation delay problem in Comparison Example 5 became obvious increasingly, while there was no signal propagation delay problem in Example 5.

In Comparison Example 6 as compared to Example 6, the main impregnating resin was epoxy resin; the Dk of the pre-treating varnish was close to the Dk of the NE-type glass fabric. The circuit board had no obvious signal propagation delay problem. However, higher Df of the circuit board resulted in a higher board insertion loss.

In Comparison Example 7 as compared to Example 7, the amount of the first component filler is higher, and the amount of the second component filler is lower. At 25° C., the circuit boards had no signal propagation delay problem. With the decrease or increase of temperature, the signal propagation delay problem in Comparison Example 7 became obvious increasingly, while there was no signal propagation delay problem in Example 7.

In Comparison Example 8 as compared to Example 8, the amount of the first component filler is lower, and the amount of the second component filler is higher. At 25° C., the circuit boards had no signal propagation delay problem. With the decrease or increase of temperature, the signal propagation delay problem in Comparison Example 8 became obvious increasingly, while there was no signal propagation delay problem in Example 8.

In Comparison Example 9 as compared to Example 9, the resin content of the pre-treated glass fabric was too low to fill out the pores of the glass fabric; the circuit board had a problem of signal propagation delay; meanwhile, the circuit board had a higher Df, resulting in a higher board insertion loss.

In Comparison Example 10 as compared to Example 10, although the circuit board had no problem of signal propagation delay, and the board insertion loss was not very high, the resin content of the pre-treated glass fabric was too high; to reduce the glue amount resulted in a higher Dk of the circuit board.

As for Examples 11 and 12, since the pre-treated NE-type glass fabric was not mainly impregnated, and was directed pressed together with copper foils or copper foils covered with resin, the circuit boards had a higher Dk. However, the circuit boards had no problem of signal propagation delay, and there was a lower board insertion loss.

The aforesaid examples are only better examples of the present invention, and do not make any limits to the contents of the components of the present invention. Those skilled in the art shall know that they can make any corresponding amendments and deformations to the technical solution and concept according to the present invention. Any tiny amendment, equivalent change and modification according to the technical essence or ingredients or contents of the present invention all fall within the protection scope of the technical solution of the present invention.

The invention claimed is:

1. A process for preparing a pre-treated low Dk-type glass fabric for constituting a circuit board, comprising
   (1) preparing a pre-treating varnish by dissolving a resin composition in an organic solvent, wherein the pre-treating varnish has a dielectric constant Dk having a difference of ±5% from that of the low Dk-type glass fabric to be used at different temperatures from −55° C. to 85° C., and has a dielectric loss Df of 0.005 or less (10 GHz) at different temperatures from −55° C. to 85° C.; and
   (2) pre-impregnating the low Dk-type glass fabric in the pre-treating varnish obtained in step (1); and
   (3) drying the organic solvent to obtain a pre-treated low Dk-type glass fabric having a Dk of 5.0 or less (10 GHz), wherein the pre-treating varnish has a Dk at 10 GHz which is ±0.1 of that of the low Dk-type glass fabric;
   wherein the resin composition comprises a resin, a suitable amount of a curing agent, a first component filler, and a second component filler, wherein the resin and curing agent are in an amount of 40 parts by mass; the first component filler and second component filler are in an amount of from 45 to 60 parts by mass;
   wherein the resin is one selected from the group consisting of polyphenyl ether resin having unsaturated double bonds, polybutadiene resin, polybutadiene copolymer resin, elastomer block copolymer, or a mixture of at least two selected therefrom;
   and
   wherein the first component filler is one selected from the group consisting of titanium dioxide, calcium titanate, strontium titanate, or a mixture of at least two selected therefrom; the second component filler is one selected from the group consisting of alumina, magnesium oxide, magnesium titanate, or a mixture of at least two selected therefrom, wherein the first and second component fillers have a mass ratio of 1:(0.5-2.0).

2. The process according to claim 1, wherein the pre-treating varnish has a Dk which is ±0.1 (10 GHz) of that of the low Dk-type glass fabric.

3. The process according to claim 1, wherein
   the low Dk-type glass fabric is a NE glass fabric, and the pre-treated NE glass fabric has a resin content of from 20 wt. % to 50 wt. %.

4. A pre-treated low Dk-type glass fabric prepared according to the process of claim 1.

5. A bonding sheet prepared by the following steps:
   (1) impregnating the pre-treated low Dk-type glass fabric according to claim 4 in a resin varnish, wherein the resin varnish is prepared by dissolving a resin composition in an organic solvent, and
   (2) drying the organic solvent;
   wherein the resin composition comprises a resin, a filler and a curing agent, wherein the resin is one selected from the group consisting of polyphenyl ether resin having unsaturated double bonds, polybutadiene resin, polybutadiene copolymer resin, elastomer block copolymer, dicyclopentadiene novolac epoxy resin and cyanate ester resin, or a mixture of at least two selected therefrom; wherein the filler is one selected from the group consisting of silica, glass dust, aluminum nitride, boron nitride and aluminum hydroxide, or a mixture of at least two selected therefrom, wherein said silica comprises molten silica and crystalline silica; and wherein the curing agent is one selected from the group consisting of macromolecular anhydride curing agent, active ester, organic peroxide free radical initiator and carbon free radical initiator, or a mixture of at least two selected therefrom.

6. A circuit board prepared from the bonding sheet according to claim 5.

7. A laminate, comprising respectively superimposing metal substrates at no, one or both sides of one or more sheets of the pre-treated low Dk-type glass fabric according to claim 4.

8. A laminate, comprising respectively superimposing resin-covered copper foils at one or both sides of one or more sheets of the pre-treated low Dk-type glass fabric according to claim 4.

9. A laminate, comprising respectively superimposing resin film layers at one or both sides of one or more sheets of the pre-treated low Dk-type glass fabric according to claim 4.

10. A printed circuit board prepared by the bonding sheet according to claim 5.

11. The process according to claim 1, wherein the polyphenyl ether resin having unsaturated double bonds is one selected from the group consisting of polyphenyl ether resin having two terminal modifying groups being acryloyl groups, polyphenyl ether resin having two terminal modifying groups being styryl groups and polyphenyl ether resin having two terminal modifying groups being vinyl groups, or a mixture of at least two selected therefrom.

12. The process according to claim 1, wherein the polybutadiene resin is one selected from the group consisting of 1,2-polybutadiene resin, polybutadiene resin modified with maleic anhydride, polybutadiene resin modified with acrylate, epoxy-modified polybutadiene resin, amino-modified polybutadiene resin, polybutadiene resin modified with terminal carboxyl group and polybutadiene resin modified with terminal hydroxyl group, or a mixture of at least two selected therefrom.

13. The process according to claim 1, wherein the polybutadiene copolymer resin is one selected from the group consisting of polybutadiene-styrene copolymer resin, polybutadiene-styrene-divinyl benzene-grafted copolymer resin, styrene-butadiene copolymer resin modified with maleic anhydride, and styrene-butadiene copolymer resin modified with acrylate, or a mixture of at least two selected therefrom.

14. The process according to claim 1, wherein the elastomer block copolymer is one selected from the group consisting of styrene-butadiene diblock copolymer, styrene-butadiene-styrene triblock copolymer, styrene-(ethylene-butylene)-styrene triblock copolymer, styrene-isoprene diblock copolymer, styrene-isoprene-styrene triblock copolymer, styrene-(ethylene-propylene)-styrene triblock copolymer, and styrene-(ethylene-butylene) diblock copolymer, or a mixture of at least two selected therefrom.

15. The process according to claim 1, wherein the curing agent is one selected from the group consisting of organic peroxide free radical initiator, carbon free radical initiator, or a mixture of at least two selected therefrom.

16. The process according to claim 1, wherein the organic solvent is one selected from the group consisting of aromatic hydrocarbon solvents such as toluene, xylol and mesitylene, or a mixture of at least two selected therefrom.

17. The process according to claim 3, wherein when the NE glass fabric has a mass area ratio of less than 30 $g/m^2$, the pre-treated NE glass fabric has a resin content of from 25 wt. % to 50 wt. %;
when the NE glass fabric has a mass area ratio of from 30 $g/m^2$ to 100 $g/m^2$, the pre-treated NE glass fabric has a resin content of from 20 wt. % to 45 wt. %; and
when the NE glass fabric has a mass area ratio of from 100 $g/m^2$ to 175 $g/m^2$, the pre-treated NE glass fabric has a resin content of from 20 wt. % to 40 wt. %.

18. The bonding sheet according to claim 5, wherein the organic peroxide free radical initiator is one selected from the group consisting of dicumyl peroxide, 1,3-bi(tertiary-butyl-peroxy isopropyl)benzene, 2,5-di-t-butyl-peroxy-2,5-dimethylhexane, 2,5-di-t-butyl-peroxy-2,5-dimethyl-hexyne-3, di-t-butyl-peroxide, t-butyl cumyl peroxide, or a mixture of at least two selected therefrom.

19. The bonding sheet according to claim 5, wherein the carbon free radical initiator is one selected from the group consisting of 2,3-dimethyl-2,3-diphenylbutane, 2,3-dimethyl-2,3-di(4-methylphenyl)butane, 2,3-dimethyl-2,3-di(4-isopropyl-phenyl)butane, 3,4-dimethyl-3,4-diphenylhexane, or a mixture of at least two selected therefrom.

20. A printed circuit board prepared by the circuit board according to claim 6.

21. A printed circuit board prepared by the laminate according to claim 7.

\* \* \* \* \*